US011775203B2

(12) United States Patent
Seo et al.

(10) Patent No.: US 11,775,203 B2
(45) Date of Patent: Oct. 3, 2023

(54) STORAGE DEVICE INCLUDING NONVOLATILE MEMORY DEVICE AND METHOD OF OPERATING THE SAME

(71) Applicant: SAMSUNG ELECTRONICS CO., LTD., Suwon-si (KR)

(72) Inventors: Youngdeok Seo, Seoul (KR); Jinyoung Kim, Seoul (KR); Sehwan Park, Yongin-si (KR); Dongmin Shin, Seoul (KR); Woohyun Kang, Hwaseong-si (KR); Shinho Oh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 71 days.

(21) Appl. No.: 17/376,437

(22) Filed: Jul. 15, 2021

(65) Prior Publication Data
US 2022/0214826 A1 Jul. 7, 2022

(30) Foreign Application Priority Data
Jan. 5, 2021 (KR) ........................ 10-2021-0000756

(51) Int. Cl.
G06F 3/00 (2006.01)
G06F 3/06 (2006.01)
G06N 3/08 (2023.01)
(52) U.S. Cl.
CPC ............ *G06F 3/0655* (2013.01); *G06F 3/064* (2013.01); *G06F 3/0604* (2013.01); *G06F 3/0679* (2013.01); *G06N 3/08* (2013.01)

(58) Field of Classification Search
None
See application file for complete search history.

(56) References Cited

U.S. PATENT DOCUMENTS

| | | |
|---|---|---|
| 7,031,210 B2 | 4/2006 | Park et al. |
| 8,693,259 B2 | 4/2014 | Koch et al. |
| 9,753,847 B2 | 9/2017 | Syu |
| 2020/0089407 A1 | 3/2020 | Baca et al. |
| 2020/0151539 A1 | 5/2020 | Oh et al. |
| 2020/0167274 A1 | 5/2020 | Bahirat et al. |
| 2022/0238170 A1* | 7/2022 | Kang .................. G11C 29/025 |

* cited by examiner

*Primary Examiner* — Midys Rojas
(74) *Attorney, Agent, or Firm* — Sughrue Mion, PLLC

(57) ABSTRACT

A method of operating a nonvolatile memory device is provided. The method includes: dividing a memory block of a plurality of memory blocks provided in the nonvolatile memory device into a plurality of retention groups; generating time-difference information including a plurality of erase program interval (EPI) values corresponding to the plurality of retention groups; generating offset information including a plurality of offset values corresponding to differences between a plurality of default read voltages and a plurality of corrected read voltages; generating compensated read voltages corresponding to a read address based on the offset information and the time-difference information; and performing a read operation to read data from the nonvolatile memory device based on the read address and the compensated read voltages.

20 Claims, 21 Drawing Sheets

| MEMORY BLOCK | DEFAULT READ VOLTAGES | | | | |
|---|---|---|---|---|---|
| BLK1 | VR11 | VR12 | VR13 | ⋯ | VR1K |
| BLK2 | VR21 | VR22 | VR23 | ⋯ | VR2K |
| BLK3 | VR31 | VR32 | VR33 | ⋯ | VR3K |
| ⋮ | ⋮ | ⋮ | ⋮ | ⋮ | ⋮ |

FIG. 20

| BLK# | WL# | TD | OFS2 | OFS4 | OFS6 | MOFS2 | MOFS4 | MOFS6 |
|---|---|---|---|---|---|---|---|---|
| 300 | 16 | -20 | -1 | -4 | -9 | 0 | -3 | -6 |
| 300 | 16 | -10 | -1 | -4 | -9 | -1 | -3 | -8 |
| 300 | 16 | 10 | -1 | -4 | -9 | -1 | -5 | -10 |
| 300 | 16 | 20 | -1 | -4 | -9 | -2 | -5 | -11 |
| 300 | 16 | 30 | -1 | -4 | -9 | -3 | -6 | -12 |
| 310 | 64 | -10 | 0 | -3 | -6 | 0 | -2 | -5 |
| 310 | 64 | -10 | 0 | -3 | -6 | 0 | -4 | -8 |

TRAINING DATA: BLK#, WL#, TD, OFS2, OFS4, OFS6
MEASURED OFFSET VALUES: MOFS2, MOFS4, MOFS6

FIG. 25

OFSINF

| MEMORY BLOCK | OFFSET VALUES | | | | |
|---|---|---|---|---|---|
| BLK1 | OFS11' | OFS12' | OFS13' | ... | OFS1K' ← UPDATE |
| BLK2 | OFS21 | OFS22 | OFS23 | ... | OFS2K |
| BLK3 | OFS31 | OFS31 | OFS33 | ... | OFS3K |
| ⋮ | ⋮ | ⋮ | ⋮ | ... | ⋮ |

FIG. 26

TDINF

| MEMORY BLOCK | EPI VALUES | | | |
|---|---|---|---|---|
| | RGRi1 | RGRi2 | RGRi3 | RGRi4 |
| BLK1 | TD11 (0→−40) | TD12 (40→0) | TD13 (160→120) | TD14 (260→220) ← UPDATE |
| BLK2 | TD21 (0) | TD22 (80) | | |
| BLK3 | TD31 (−20) | TD32 (0) | TD33 (50) | |
| ⋮ | ⋮ | ⋮ | ⋮ | ⋮ |

STORAGE DEVICE INCLUDING NONVOLATILE MEMORY DEVICE AND METHOD OF OPERATING THE SAME

CROSS-REFERENCE TO RELATED APPLICATION

This application claims priority from Korean Patent Application No. 10-2021-0000756, filed on Jan. 5, 2021 in the Korean Intellectual Property Office, the disclosure of which is incorporated herein by reference in its entirety.

BACKGROUND

1. Field

Methods, apparatuses and systems consistent with example embodiments relate generally to semiconductor integrated circuits, and more particularly to a storage device including nonvolatile memory device and a method of operating a nonvolatile memory device.

2. Discussion of Related Art

A nonvolatile memory device such as a flash memory device, a resistive memory device, etc., may store data in relation to a plurality of threshold voltage distributions, a plurality of resistance distributions, etc. Each respective "distribution" represents a corresponding logic state for stored data. Once written (or programmed) to nonvolatile memory cells, the stored data may be read by applying predetermined read voltages to the memory cells. During or after the programming of a memory cell, an intended distribution may become altered or distorted due to a number of events or conditions including, for example, charge leakage, program disturbances, read disturbances, word and/or bit line coupling, temperature change, voltage change, degeneration of the memory cell, etc. In extreme cases, an intended distribution may become so shifted and/or broadened that a "read fail" occurs.

When a read fail occurs, nonvolatile memory devices may execute a different type of a read operation than the one causing the read fail, according to a predetermined read sequence. Accordingly, "read latency" (i.e., the period of time required to read stored data) may increase when a fixed read sequence is adopted with respect to operating conditions that are varied, and performance of the nonvolatile memory device may be degraded due to the increased read latencies.

SUMMARY

Some example embodiments may provide storage device including a nonvolatile memory device, capable of efficiently compensating for variation of threshold voltage distribution of the nonvolatile memory device according to an erase program interval (EPI).

Some example embodiments may provide a method of operating a nonvolatile memory device, capable of efficiently compensating for variation of threshold voltage distribution of the nonvolatile memory device according to an EPI.

According to an aspect of an example embodiment, a method of operating a nonvolatile memory device includes: dividing a memory block of a plurality of memory blocks provided in the nonvolatile memory device into a plurality of retention groups; generating time-difference information including a plurality of erase program interval (EPI) values corresponding to the plurality of retention groups; generating offset information including a plurality of offset values corresponding to differences between a plurality of default read voltages and a plurality of corrected read voltages; generating compensated read voltages corresponding to a read address based on the offset information and the time-difference information; and performing a read operation to read data from the nonvolatile memory device based on the read address and the compensated read voltages.

According to an aspect of an example embodiment, a storage device includes a nonvolatile memory device including a plurality of memory blocks; and a storage controller configured to control the nonvolatile memory device. The storage controller is configured to: divide a memory block of the plurality of memory blocks into a plurality of retention groups; generate time-difference information including a plurality of erase program interval (EPI) values corresponding to the plurality of retention groups; generate offset information including a plurality of offset values corresponding to differences between a plurality of default read voltages and a plurality of corrected read voltages; generate compensated read voltages corresponding to a read address based on the offset information and the time-difference information; and perform a read operation to read data from the nonvolatile memory device based on the read address and the compensated read voltages.

According to an aspect of an example embodiment, a method of operating a nonvolatile memory device includes dividing a memory block, from among a plurality of memory blocks, into a plurality of retention groups; generating time-difference information including a plurality of erase program interval (EPI) values corresponding to the plurality retention groups; generating offset information including a plurality of offset values corresponding to differences between a plurality of default read voltages and a plurality of corrected read voltages; training an artificial neural network based on training EPI values and measured offset values corresponding to the training EPI values; generating compensated offset values by providing the offset information and the time-difference information to the artificial neural network; generating compensated read voltages by adding the compensated offset values to the plurality of default read voltages; and performing a read operation to read data from the nonvolatile memory device based on a read address and the compensated read voltages.

Some example embodiments may increase probability of success of the read operation and enhance performance of the nonvolatile memory device and the storage device by generating the time-difference information and adjusting the read voltages using the time difference information.

In addition, some example embodiments may further enhance the performance of the nonvolatile memory device and the storage device by generating the optimal read voltages using the artificial neural network.

In addition, some example embodiments may enhance utilization of the nonvolatile memory device by efficiently supporting a zoned space (ZNS) write scheme.

BRIEF DESCRIPTION OF THE DRAWINGS

The above and other aspects will be more clearly understood from the following description of example embodiments taken in conjunction with the accompanying drawings.

FIG. 20 is a diagram for describing process of training an artificial neural network in a method of operating a nonvolatile memory device according to example embodiments.

FIG. 25 is a diagram for describing update of offset information in a method of operating a nonvolatile memory device according to example embodiments.

FIG. 26 is a diagram for describing update of time-difference information in a method of operating a nonvolatile memory device according to example embodiments.

DETAILED DESCRIPTION

Figure 1:
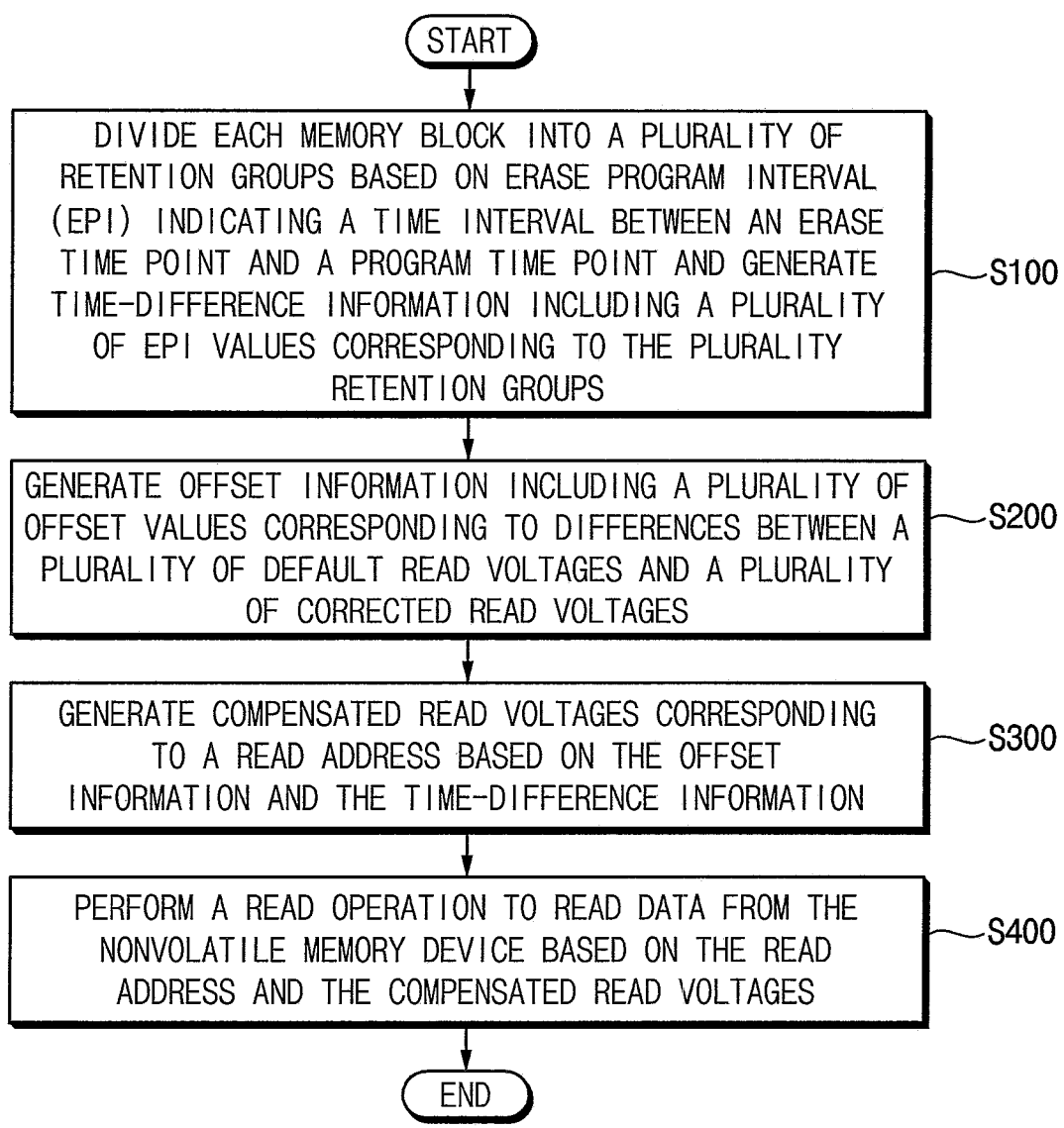
FIG. 1 is a flowchart illustrating a method of operating a nonvolatile memory device according to example embodiments.

Example embodiments will be described with reference to the accompanying drawings. In the drawings, like numerals refer to like elements throughout. Repeated descriptions may be omitted.

FIG. 1 is a flowchart illustrating a method of operating a nonvolatile memory device according to example embodiments.

Referring to FIG. 1, with respect to each memory block of a plurality of memory blocks included in a nonvolatile memory device, each memory block may be divided into a plurality of retention groups based on an erase program interval (EPI), and time-difference information including a plurality of EPI values corresponding to the plurality of retention groups may be generated (S100). The EPI indicates a time interval between an erase time point and a program time point. Example embodiments of the division of the retention groups and the generation of the time difference information will be described below with reference to FIGS. 2 through 8.

With respect to each memory block, offset information including a plurality of offset values corresponding to differences between a plurality of default read voltages and a plurality of corrected read voltages may be generated (S200). The plurality of default read voltages may be determined through test processes of the nonvolatile memory device. The plurality of corrected read voltages may be determined and updated through a valley search operation as will be described below with reference to FIG. 24.

Compensated read voltages corresponding to a read address may be generated based on the offset information and the time-difference information (S300). In some example embodiments, as will be described below with reference to FIGS. 15 through 21, compensated offset values may be generated by applying the offset information and the time difference information to the artificial neural network, and the compensated read voltages may be generated based on the compensated offset values. In some example embodiments, a mapping table may be generated in advance by measuring the threshold voltage distribution of the nonvolatile memory device such that the mapping table may include mapping relation between the plurality of offset values of the offset information, the EPI values of the time difference information and the compensated offset values, and the compensated read voltages may be generated using the mapping table.

A read operation to read data from the nonvolatile memory device may be performed based on the read address and the compensated read voltages (S400). The operations and the configurations of the nonvolatile memory device will be described with reference to FIGS. 9 through 14.

As such, the method of operating the nonvolatile memory device according to example embodiments may increase probability of success of the read operation, and enhance performance of the nonvolatile memory device and the storage device including the nonvolatile memory device by generating the time-difference information and adjusting the read voltages using the time difference information.

Figure 2:
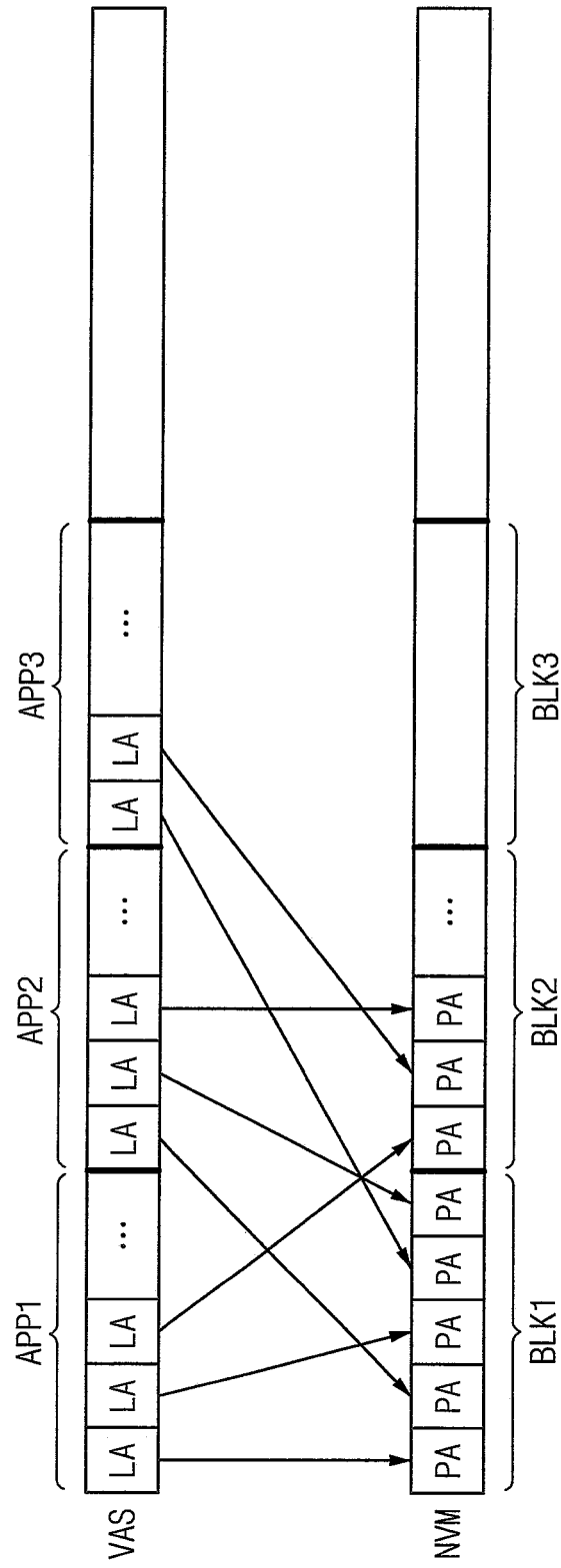
FIGS. 2 and 3 are diagrams illustrating address mapping in a nonvolatile memory device according to example embodiments.
Figure 3:
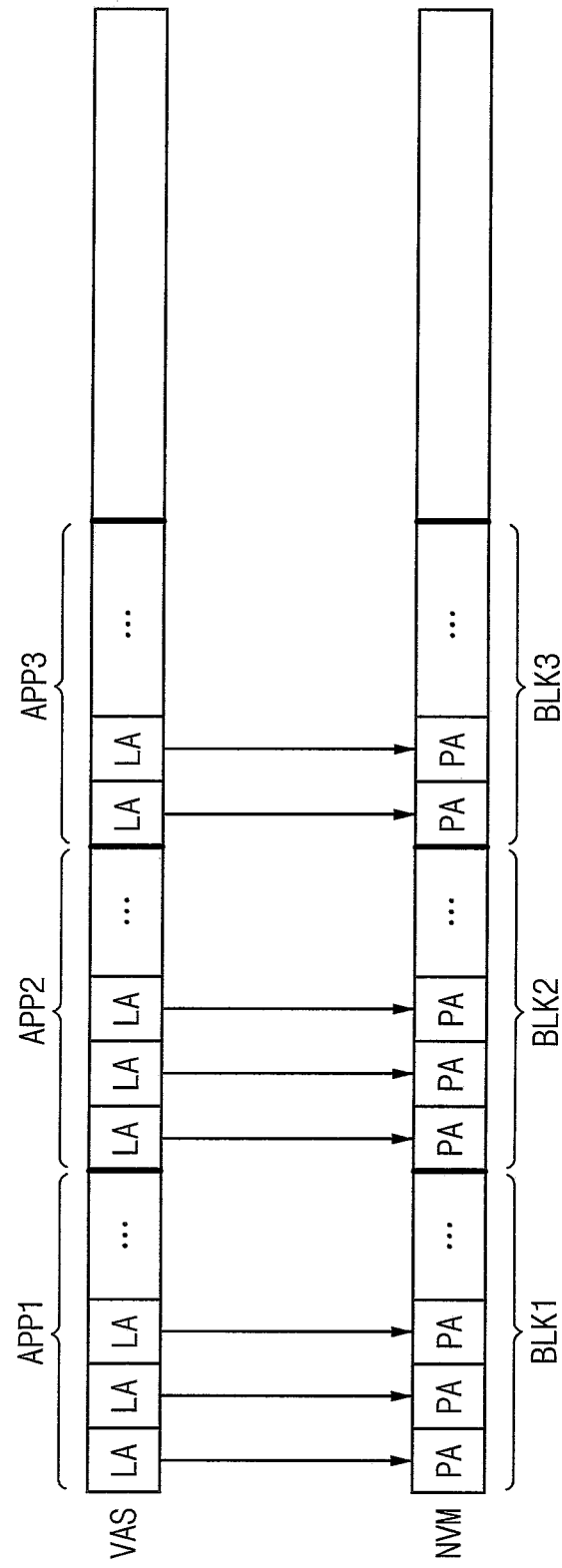

FIGS. 2 and 3 are diagrams illustrating example embodiments of address mapping in a nonvolatile memory device according to example embodiments.

Referring to FIGS. 2 and 3, a host device may execute a plurality of applications APP1, APP2 and APP3 simultaneously or in parallel, and respective address spaces for the plurality of applications APP1, APP2 and APP3 may be assigned in a virtual address space VAS that is managed by the host device. Logical addresses LA of the virtual address space may be mapped to physical addresses PA of the nonvolatile memory device NVM, for example, by a flash translation layer (FTL) of the nonvolatile memory device NVM. Data corresponding to the logical addresses LA may be written or programmed in memory blocks BLK1, BLK2 and BLK3 of the nonvolatile memory device NVM corresponding to the physical addresses PA.

FIG. 2 illustrates address mapping corresponding to a sequential write scheme such that data are written sequentially in the nonvolatile memory device NVM according to an order of write requests of the host device, without division of the applications APP1, APP2 and APP3. In this case, data of different applications may be written in the same memory block. For example, as shown in FIG. 2, data of each of the applications APP1, APP2 and APP3 are written in memory block BLK1. When the data written in the memory block are subsequently changed, the logical address of the data to be changed is mapped to a new physical address and new data are written in a memory region corresponding to the newly mapped physical address. If invalid data or dirty data are increased in the memory blocks, a garbage collection may be performed to write only the valid data in the memory blocks in another memory block. The data transfer between the host device and the storage device including the nonvolatile memory device is inhibited during the garbage collection and the overhead of the garbage collection may degrade performance of the storage device and a system including the storage device. In addition, the frequent garbage collection increases the number of the erase operation and the write operation, which may shorten the lifetime of the storage device.

FIG. 3 illustrates address mapping corresponding to a zoned space (ZNS) write scheme such that each memory block stores data corresponding to a single application. According to the ZNS write scheme, data corresponding to each of the applications APP1, APP2 and APP3 may be stored sequentially in a predetermined zone (e.g., one or more memory blocks). For example, as shown in FIG. 3 data corresponding to application APP1 is stored in memory block BLK1, data corresponding to application APP2 is stored in memory block BLK2, and data corresponding to application APP3 is stored in memory block BLK3. Thus, the erase operation may be performed by units of zone and thus the frequency of the garbage collection may be decreased. Accordingly, the overhead of the garbage collection may be decreased and the lifetime of the storage device may be prolonged by decreasing the number of the erase operation and the write operation. In addition, the number of memory blocks for the garbage collection may be decreased and thus the memory space of the nonvolatile memory device may be used efficiently.

Figure 4:
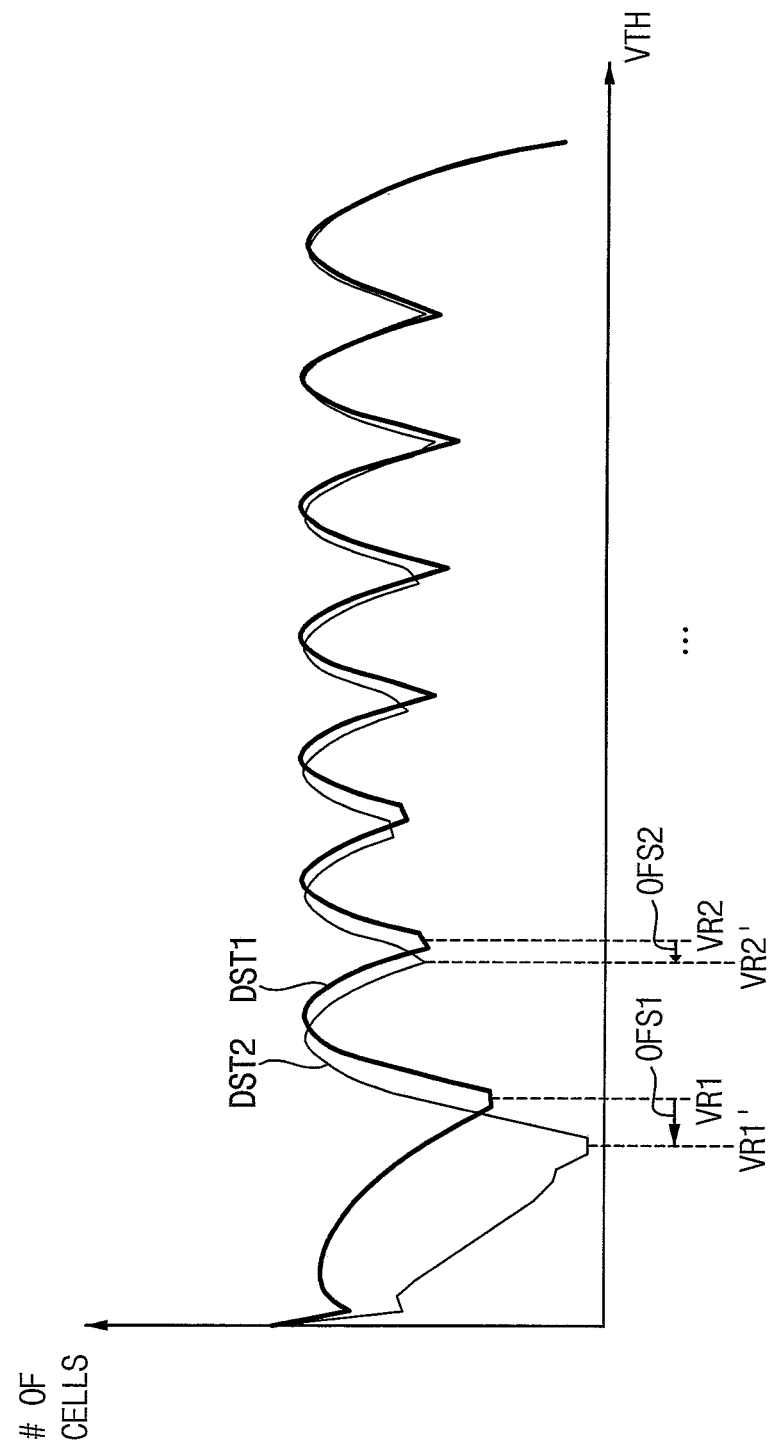
FIG. 4 is a diagram illustrating variation of a threshold voltage distribution according to an erase program interval (EPI).

FIG. 4 is a diagram illustrating variation of a threshold voltage distribution according to an erase program interval (EPI).

In FIG. 4, the horizontal axis indicates a threshold voltage VTH of memory cells and the vertical axis indicates the number of memory cells corresponding to the threshold voltage VTH. A first distribution DST1 corresponds to the threshold voltage distribution just after a program time point, and a second distribution DST2 corresponds to the threshold voltage distribution after a relatively long time has elapsed from the program time point.

The variation of the threshold voltage becomes severe as the EPI (indicating a time interval between an erase time point and a program time point) increases, and the variation of the threshold voltage is prominent in the lower threshold voltage, as illustrated in FIG. 4. The default read voltages VR1 and VR2 may be optimal read voltage in case of the first distribution DST1. In contrast, it is required to obtain corrected read voltages VR1' and VR2' in case of the second distribution DST2, for example, through the valley search operation as will be described below with reference to FIG. 24.

The above-described offset values OFS1 and OFS2 correspond to differences between the default read voltages VR1 and VR2 and the corrected read voltages VR1' and VR2', respectively. The corrected read voltages VR1' and VR2' may be changed depending on the EPI. Thus, the corrected read voltages VR1' and VR2' need to be updated timely and the time for updating the corrected read voltages VR1' and VR2' may be a factor degrading the performance of the storage device.

Even though the ZNS write scheme as illustrated in FIG. 3 has many advantages, the read voltages may need to be updated frequently because the data stored in the same block have may have the large EPI difference. Accordingly, an EPI close policy may be adopted such that the program of a memory block is inhibited if the EPI of the memory block exceeds a predetermined threshold value, but the EPI close policy may degrade utilization of the memory space of the nonvolatile memory device.

According to example embodiments, the compensated read voltages may be generated or determined based on the time difference information and the offset information as described above before performing the updating of the corrected read voltages that requires a long time. As a result, the EPI close policy may not be applied, or the threshold value to apply the EPI close may be increased, and thus an amount of data stored in each memory block may be increased.

As such, the storage device including the nonvolatile memory device and the method of operating the nonvolatile memory device may enhance utilization of the nonvolatile memory device by efficiently supporting the ZNS write scheme.

Figures 5, 6:
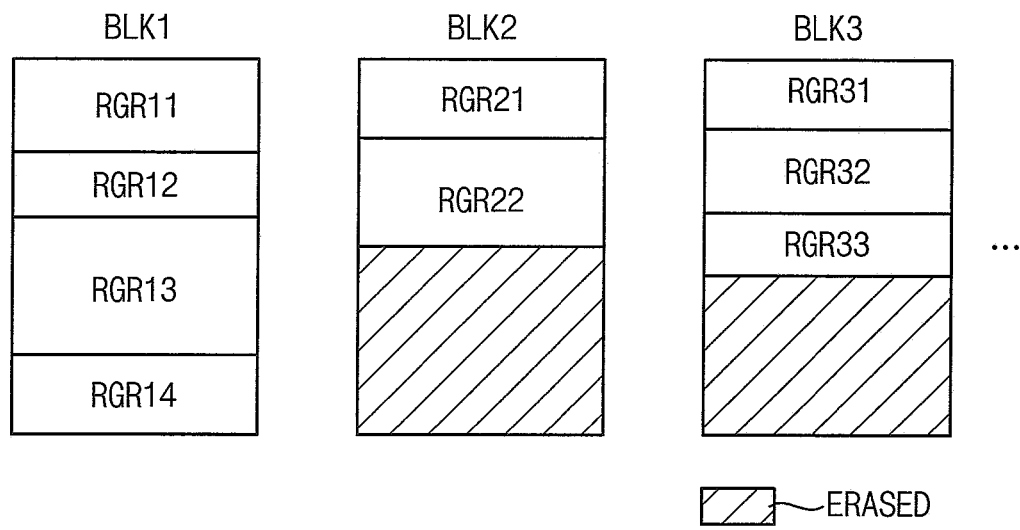
FIG. 5 is a diagram illustrating memory blocks grouped into retention groups in a nonvolatile memory device according to example embodiments.
FIG. 6 is a diagram illustrating default read voltages in a nonvolatile memory device according to example embodiments.

FIG. 5 is a diagram illustrating memory blocks grouped into retention groups in a nonvolatile memory device according to example embodiments.

FIG. 5 illustrates three memory blocks for convenience of illustration and description, and the number of memory blocks to which the ZNS write scheme is applied may be determined variously depending on the number of the applications performed by the host device, the amount of data stored in the nonvolatile memory device by the applications, etc.

For example, as illustrated in FIG. 5, a first memory block BLK1 may include first through fourth retention groups RGR11~RGR14, a second memory block BLK2 may include first and second retention groups RGR21 and RGR22, and a third memory block BLK3 may include first through third retention groups RGR31~RGR33. When data are stored in all memory regions of the first memory blocks BLK1, another erased memory block may be assigned to the same zone as the first memory block BLK1 to store new data of the corresponding application. The second and third memory blocks BLK2 and BLK3 may include memory regions remaining in the erased state, and new data of the corresponding applications may be stored in the memory regions of the erased state.

The division of the retention groups may be implemented based on a variety of criteria. For example, the data sequentially programmed in a memory block may be included in the same retention group, and the data programmed in the memory block after a predetermined reference time may be assigned to a new retention group. The reference time for the division of the retention groups may be determined properly according to operation characteristics of the nonvolatile memory device.

FIG. 6 is a diagram illustrating default read voltages in a nonvolatile memory device according to example embodiments.

Referring to FIG. 6, the default read voltages may be determined through test processes of the nonvolatile memory device. The test processes to determine the default read voltages may be performed while the nonvolatile memory device is manufactured and/or after the nonvolatile memory device is packaged into a storage device.

For example, as illustrated in FIG. 6, first through k-th default read voltages VR11~VR1$k$ may be determined with respect to the first memory block BLK1, first through k-th default read voltages VR21~VR2$k$ may be determined with respect to the second memory block BLK2, and first through k-th default read voltages VR31~VR3$k$ may be determined with respect to the third memory block BLK1. According to characteristics of the memory blocks BLK1~BLK3, the default read voltages of the different memory blocks may be equal or different.

Figure 7:
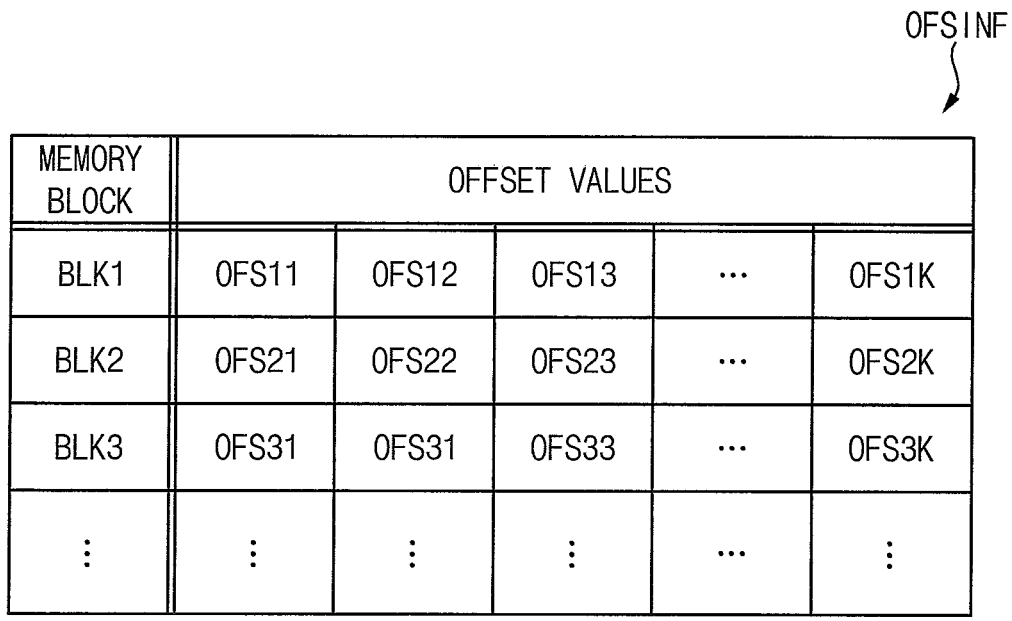
FIG. 7 is a diagram illustrating offset information in a method of operating a nonvolatile memory device according to example embodiments.

FIG. 7 is a diagram illustrating offset information in a method of operating a nonvolatile memory device according to example embodiments.

Referring to FIG. 7, offset information OFSINF may include a plurality of offset values corresponding to differences between a plurality of default read voltages and a plurality of corrected read voltages. Each offset value OFSij (i, j are natural numbers) corresponds to a difference between each default read voltage VRij and each corrected read voltage VRij' as described with reference to FIG. 4.

For example, as illustrated in FIG. 7, first through k-th offset values OFS11~OFS1$k$ may be determined with respect to the first memory block BLK1, first through k-th offset values OFS21~OFS2$k$ may be determined with respect to the second memory block BLK2, and first through k-th offset values OFS31~OFS3$k$ may be determined with respect to the third memory block BLK3. The offset information OFSINF may be deleted or invalidated when the storage device 3000 is powered off and the offset values in the offset information OFSINF may be initialized with the value of zero when the storage device 3000 is powered on. The initialized offset values of the offset information OFSINF may be maintained at zero until the corresponding corrected read voltages are updated.

Figure 8:
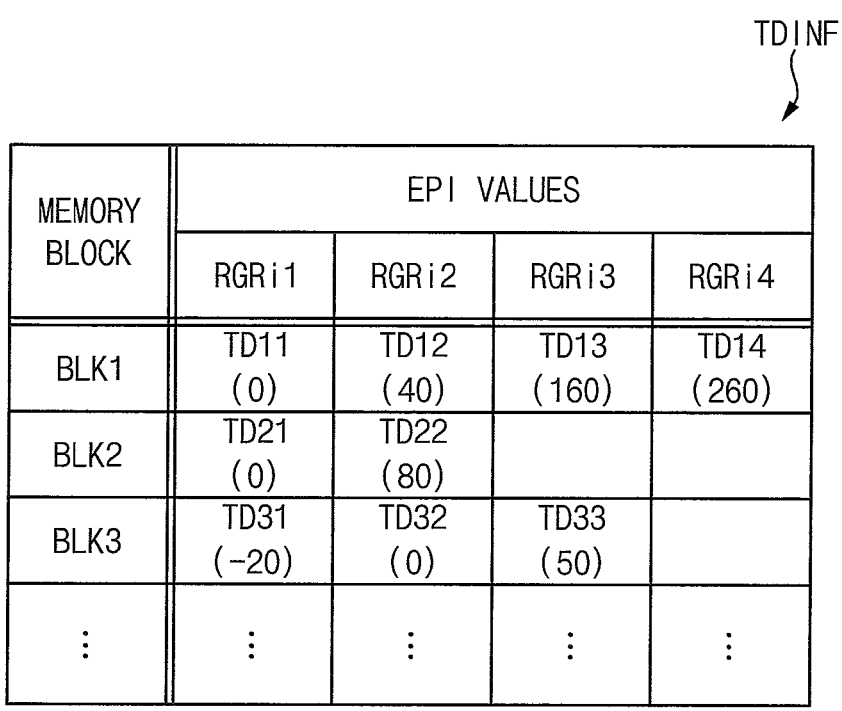
FIG. 8 is a diagram illustrating time-difference information in a method of operating a nonvolatile memory device according to example embodiments.

FIG. 8 is a diagram illustrating an example embodiment of time-difference information in a method of operating a nonvolatile memory device according to example embodiments.

Referring to FIG. 8, time difference information TDINF may include a plurality of EPI values corresponding to a plurality retention groups with respect to each memory block. The EPI values may not indicate absolute times of the EPI but indicate relative time differences between the retention groups. FIG. 8 illustrates, for convenience of illustration and description, that a maximum number of the retention groups in each memory block is four. The number of the target retention groups in each memory block may be determined variously depending on the EPI distribution by the ZNS write scheme.

For example, as illustrated in FIG. 8, first through fourth EPI values TD11~TD14 may be determined with respect to first through fourth retention groups RGR11~RGR14 of the first memory block BLK1, first and second EPI values TD21 and TD22 may be determined with respect to first and second retention groups RGR21 and RGR22 of the second memory block BLK2, and first through third EPI values TD31~TD33 may be determined with respect to first through third retention groups RGR31~RGR33 of the third memory block BLK3.

FIG. 8 illustrates example EPI values in parentheses. With respect to each memory block, the retention group having the EPI value of zero may be referred to as a reference retention group. In the example of FIG. 8, the first retention group RGR11 is the reference retention group with respect to the first memory block BLK1, the first retention group RGR21 is the reference retention group with respect to the second memory block BLK2, and the second retention group RGR32 is the reference retention group with respect to the third memory block BLK3. The EPI values of the retention groups other than the reference retention group may be represented by values that are relative to the EPI value (that is, zero) of the reference retention group. For example, with respect to the third memory block, the first retention group RGR31 may have the EPI value that is 20 less than the second retention group RGR32 corresponding to the reference retention group, and the third retention group may have the EPI value that is 50 greater than the second retention group RGR32. The unit of the EPI values may be a second, a minute, an hour, etc.

In some example embodiments, the corrected read voltages corresponding to the reference retention group may be equal to the compensated read voltages. In this case, the generation or determination of the compensated read voltages may be omitted, and the corrected read voltages that are updated recently may be used as the compensated read voltages.

Hereinafter, operations and configurations of a nonvolatile memory device and a storage system are described with reference to FIGS. 9 through 14.

Figure 9:
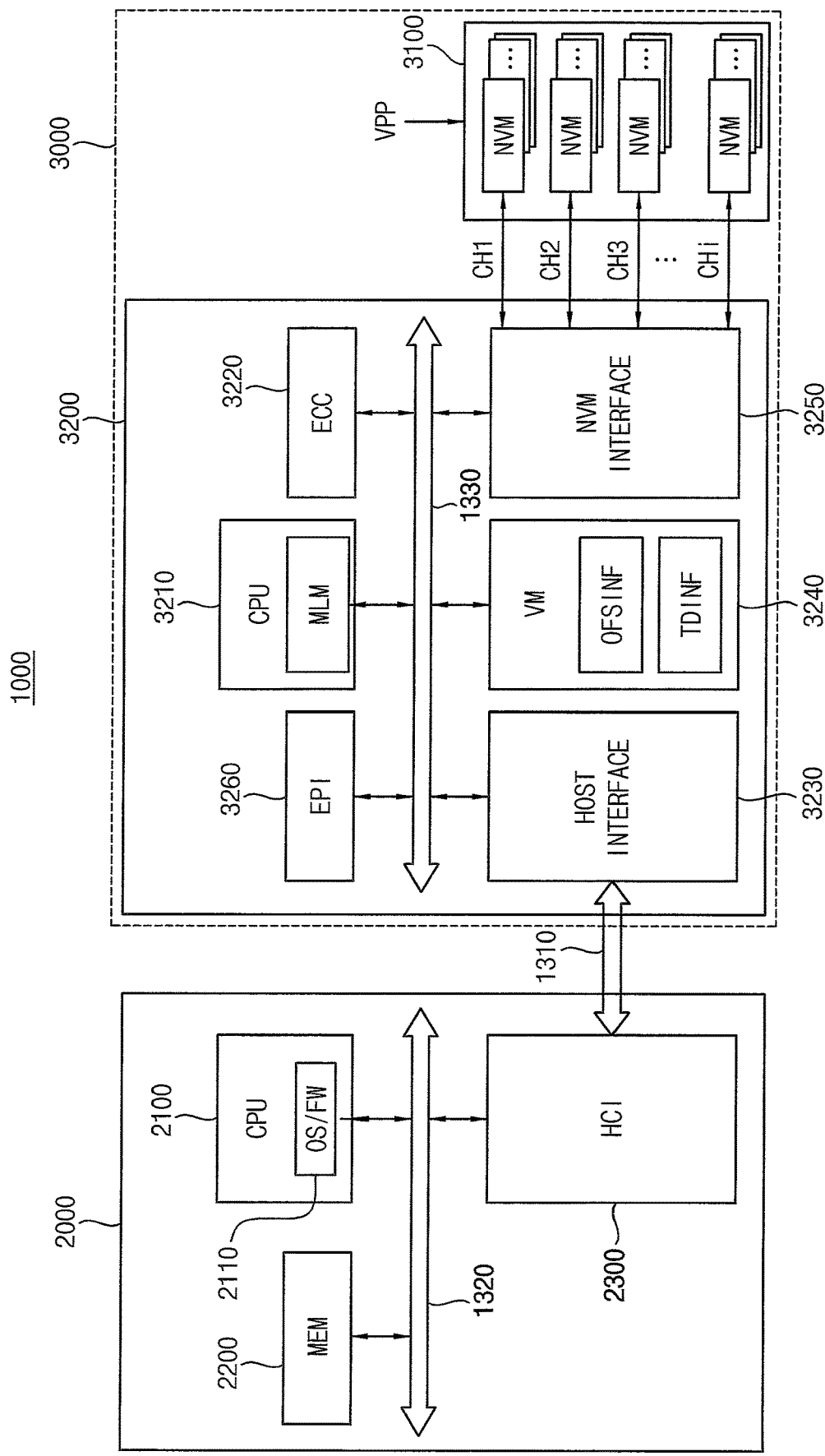
FIG. 9 is a block diagram illustrating a storage system according to example embodiments.

FIG. 9 is a block diagram illustrating a storage system according to example embodiments.

Referring to FIG. 9, a system 1000 includes a host device 2000 and a storage device 3000. For example, the storage device 3000 may be an embedded multimedia card (eMMC), a solid state drive (SSD), a universal flash storage (UFS), etc.

The host device 2000 may be configured to control data processing operations, such as data read operations and data write operations. The data processing operations may be performed at a single data rate (SDR) or a double data rate (DDR).

The host device 2000 may be a data processing device, such as a central processing unit (CPU), a processor, a microprocessor, or an application processor, which can process data. The host device 2000 and the storage device 3000 may be embedded or implemented in an electronic device. The system 1000 of FIG. 9 may be an arbitrary electronic device.

The storage device 3000 may be electrically connected with other components of the system 1000 (electronic device) through connection components (e.g., pads, pins, buses, or communication lines) to communicate with the host device 2000. The host device 2000 may include a processor (CPU) 2100, memory (MEM) 2200 and a host controller interface (HCI) 2300 connected through a bus 1320. An operating system (OS) and/or host firmware (FW) 2110 may be driven by the processor 2100. The processor 2100 may include hardware and/or software for controlling generation of a command CMD, analysis of a response RES, storing of data in a register, e.g., an extended (EXT)_CSD register, of the storage device 3000, and/or data processing. The processor 2100 may drive the operation system and the host firmware 2110 to perform these operations. The host controller interface 2300 may interface with the storage device 3000.

The storage device 3000 may include multiple nonvolatile memory devices (NVM) 3100 and a storage controller 3200. In some example embodiments, the storage controller 3200 may be a memory controller. The nonvolatile memory devices 3100 may be optionally supplied with an external high voltage VPP. The nonvolatile memory devices 3100 may be implemented with flash memory, ferroelectric random access memory (FRAM), phase-change random access memory (PRAM), magnetic random access memory (MRAM), etc.

The storage controller 3200 may be connected to the nonvolatile memory devices 3100 through multiple channels CH1 to CHi. The storage controller 3200 may include one or more processors 3210, an ECC block 3220, a host interface 3230, a volatile memory device 3240, a nonvolatile memory interface 3250 and an EPI detector 3260.

The volatile memory device 3240 may store data used to drive the storage controller 3200. Although FIG. 9 illustrates an example embodiment where the volatile memory device 3240 is included in the storage controller 3200, example embodiments are not limited thereto. For example, the volatile memory device 3240 may be placed outside the storage controller 3200. The offset information OFSINF and the time difference information TDINF as described above may be stored in the volatile memory device 3240.

The ECC block 3220 may calculate error correction code values of data to be programmed at a writing operation, and may correct an error of read data using an error correction code value at a read operation.

The processor 3210 is configured to control overall operations of the storage controller 3200. For example, the processor 3210 may operate firmware including a flash translation layer (FTL), etc. The FTL may perform various functions, e.g., address mapping, read calibration, error correction, etc.

According to example embodiments, the processor 3210 may include an artificial neural network module or a machine learning module MLM. Example embodiments are described based on the artificial neural network in this disclosure. The artificial neural network module may be equal to the machine learning module and example embodiments may be applied to various kinds of machine learning modules. The machine learning module MLM may be implemented as hardware, software or a combination of hardware and software. The machine learning module MLM will be described below with reference to FIGS. 16 through 18.

The EPI detector 3260 may include at least one timer to detect the EPI of the memory blocks of the nonvolatile memory devices NVM. In some example embodiments, the EPI detector 3260 may include at least one counter to measure a time based on clock counting. According to example embodiments, each counter may be assigned to each memory block, or one timer may be shared by two or memory blocks. The EPI detector 3260 may detect the EPI values by units of page of a memory block.

Figure 10:
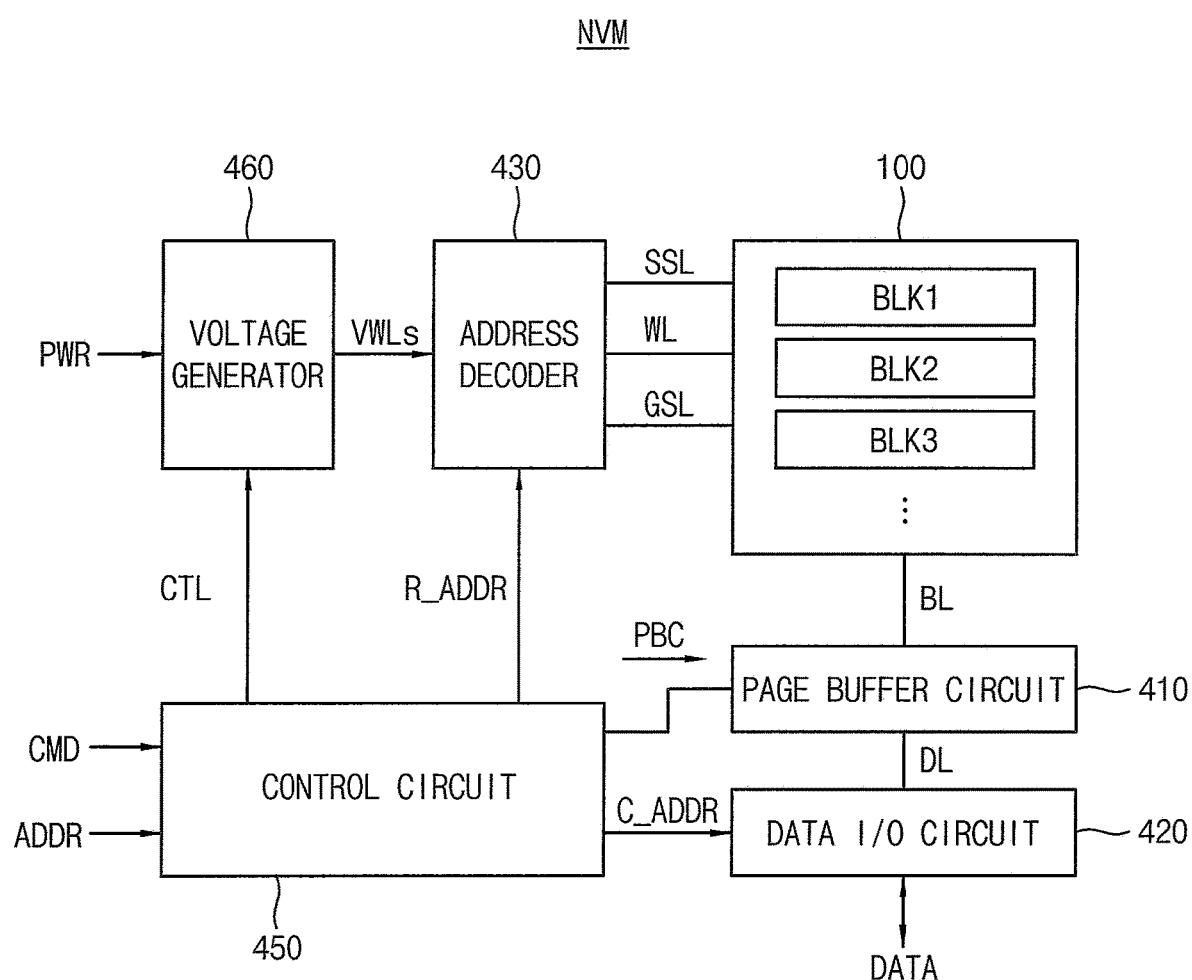
FIG. 10 is a block diagram illustrating a nonvolatile memory device according to example embodiments.

FIG. 10 is a block diagram illustrating a nonvolatile memory device according to example embodiments.

Referring to FIG. 10, a nonvolatile memory device NVM includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory blocks BLK1~BLK3 and each memory block may include memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from a storage controller and control erasure, programming (or write) and read operations of the nonvolatile memory device NVM based on the command signal CMD and the address signal ADDR. An erasure operation may include performing a sequence of erase loops, and a program operation may include performing a sequence of program loops. Each program loop may include a program period and a program verification period. Each erase loop may include an erase period and an erase verification period. The read operation may include a normal read operation and data recover read operation.

For example, the control circuit 450 may generate the control signals CTL, which are used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL except for the selected word line as unselected word lines based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines based on the row address R_ADDR.

The voltage generator 460 may generate word line voltages VWL, which are required for the operation of the memory cell array 100 of the nonvolatile memory device NVM, based on the control signals CTL. The voltage generator 460 may receive power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to only one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write this read data to a second area of the memory cell array 100 (e.g., without transmitting the data to a source external to the nonvolatile memory device NVM, such as to the memory controller 20). That is, the page buffer circuit 410 and the data input/output circuit 420 may perform a copy-back operation.

Figure 11:
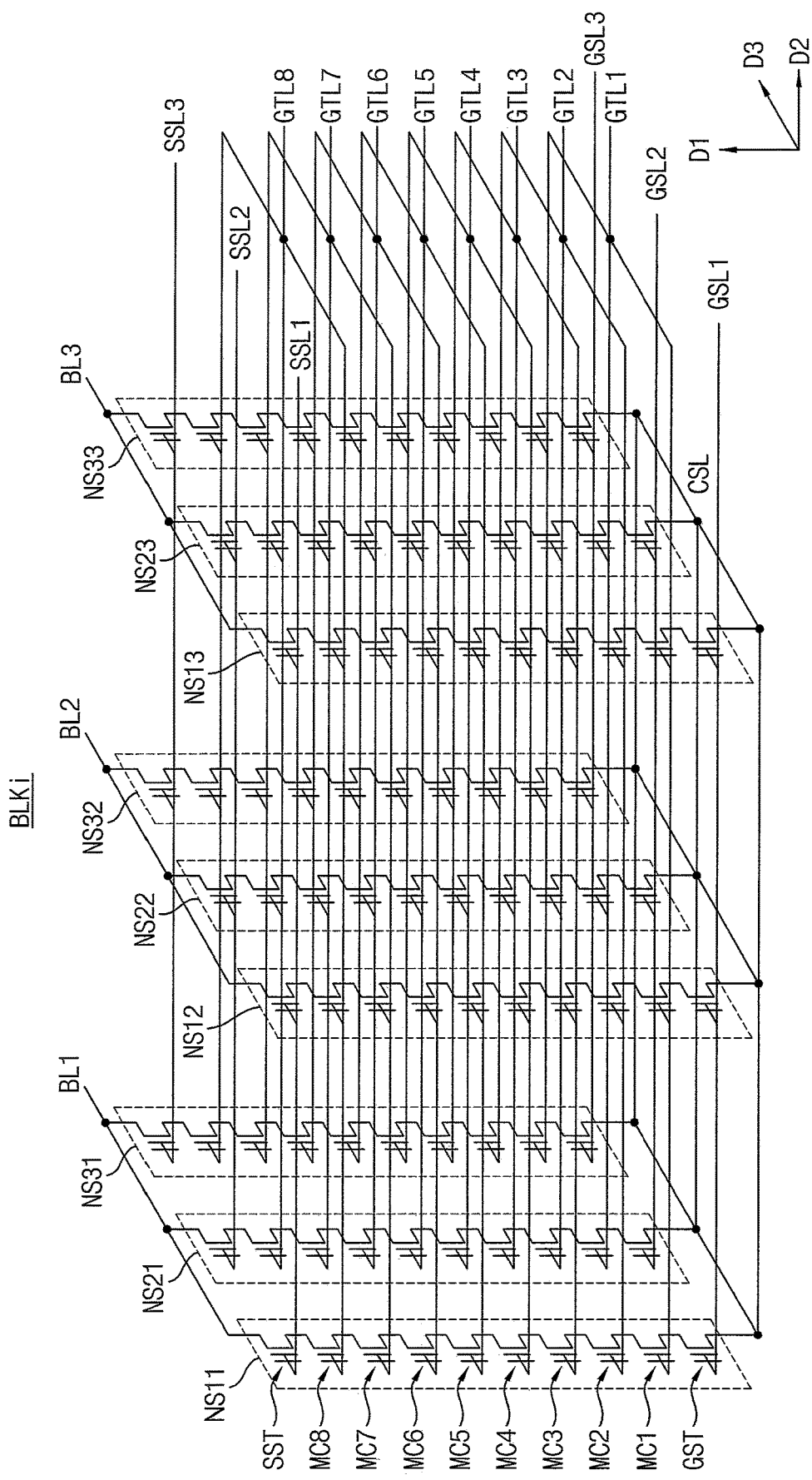
FIG. 11 is a circuit diagram illustrating an equivalent circuit of a memory block included in the nonvolatile memory device of FIG. 10.

FIG. 11 is a circuit diagram illustrating an equivalent circuit of a memory block included in the nonvolatile memory device of FIG. 10.

In FIG. 11, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction.

The memory block BLKi of FIG. 11 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 11, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 11, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. The gate lines corresponding to the intermediate switching lines may be separated as will be described below. In FIG. 11, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

The three-dimensional NAND flash memory device or the vertical NAND flash memory has been described with reference to FIG. 11 as a nonvolatile memory device to which example embodiment applied, but example embodiments are not limited to specific memory types. For example, example embodiments may be applied to various nonvolatile memory devices such as phase-change random access memory (PRAM), magnetic random access memory (MRAM), resistive random access memory (RRAM), ferroelectric random access memory (FRAM), etc.

Hereinafter, example embodiments are described based on a triple level cell (TLC) scheme such that three bits are stored in each memory cell, but example embodiments are not limited to the TLC scheme. According to example embodiments, two, four or more bits may be stored in each memory cell.

Figure 12:
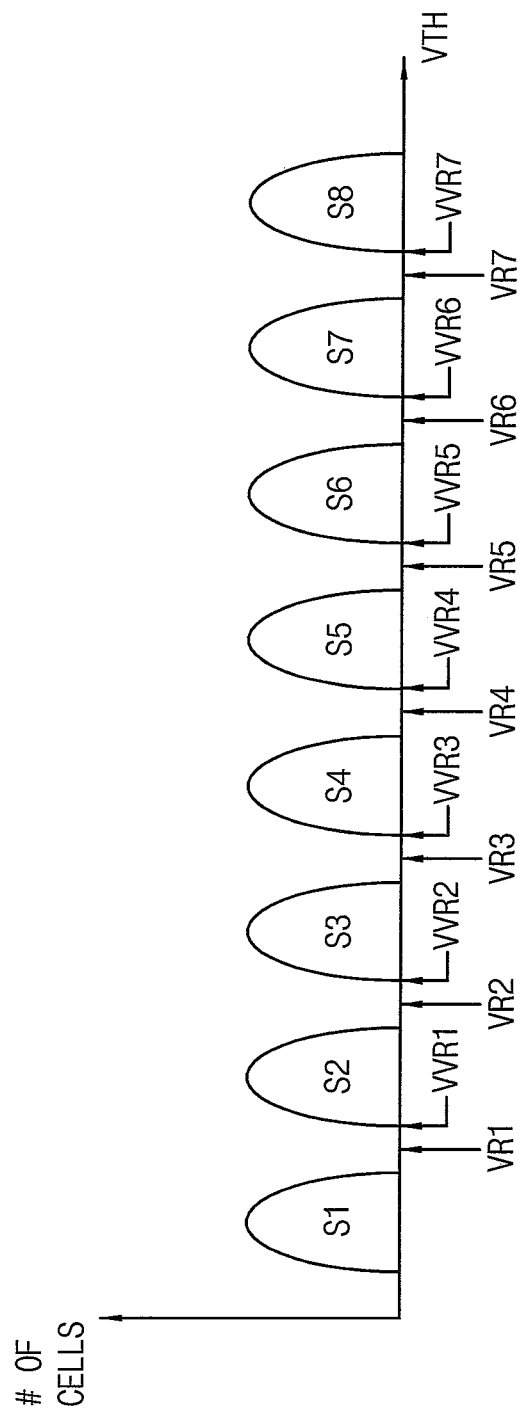
FIG. 12 is a diagram illustrating an example of states of multi-level cells included in a nonvolatile memory device according to example embodiments.

FIG. 12 is a diagram illustrating an example of states of multi-level cells included in a nonvolatile memory device according to example embodiments.

In FIG. 12, the horizontal axis represents a threshold voltage of a memory cell and the vertical axis represents the number of memory cells corresponding to the threshold voltage. During the program operation, the program success of the first through eighth states S1~S8 may be confirmed by applying first through seventh verification read voltage VVR1~VVR7 to the selected word line. In addition, during the normal read operation, the first through eighth states S1~S8 may be distinguished by applying at least a portion of first through seventh normal read voltages VR1~VR7 to the selected word line as will be described below with reference to FIG. 14. Hereinafter, a read voltage may be considered as a normal read voltage, which is differentiated from a verification read voltage, if it is not mentioned particularly.

Figures 13, 14:
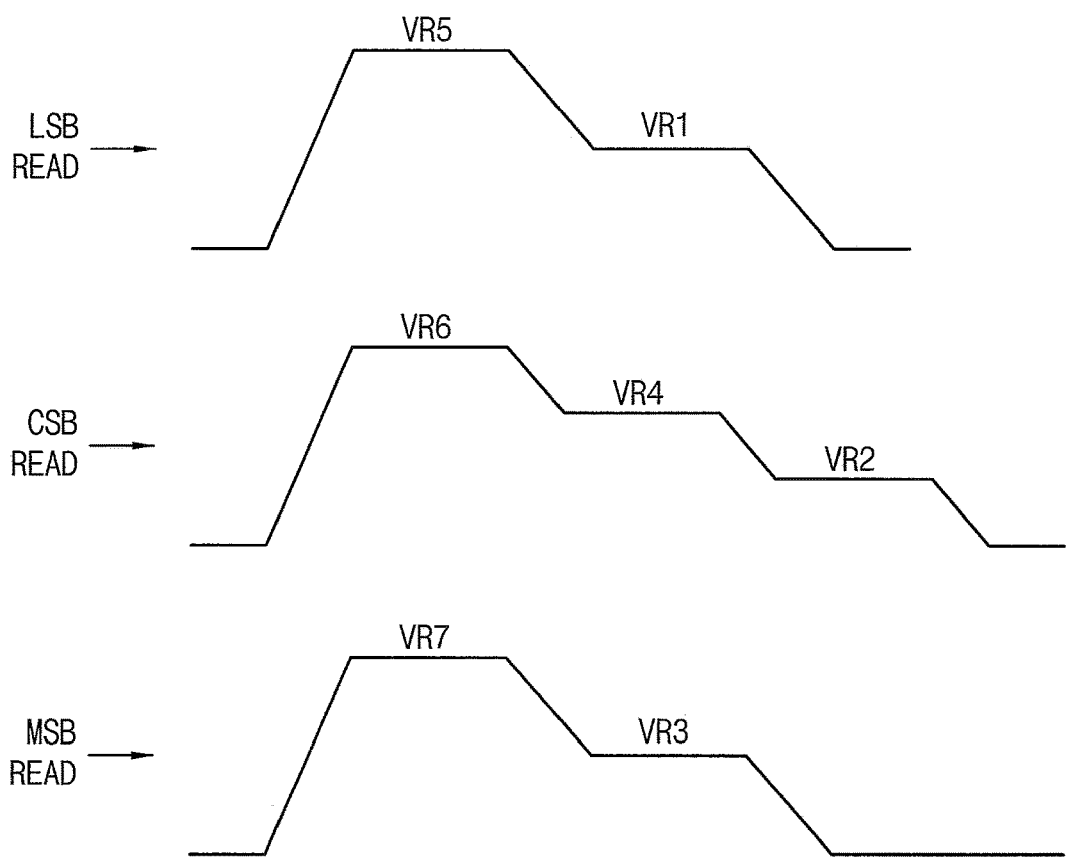
FIG. 13 is a diagram illustrating an example of state-bit mapping information indication mapping relationship between the states in FIG. 12 and bit values.
FIG. 14 is a diagram illustrating a read operation corresponding to the state-bit mapping information of FIG. 13.

FIG. 13 is a diagram illustrating an example of state-bit mapping information indication mapping relationship between the states in FIG. 12 and bit values, and FIG. 14 is a diagram illustrating a read operation corresponding to the state-bit mapping information of FIG. 13.

Referring to FIG. 13, the state-bit mapping information MINF may indicate the mapping relationships between the states and the bits stored in the plurality of multi-level cells. FIG. 13 illustrates an example of bit values corresponding to the first through eighth states S1~S8 in FIG. 12. The first through eighth states S1~S8 may be represented by different values corresponding to least significant bit (LSB), a centered bit (CSB) and a most significant bit (MSB), that is, different values of first, second and third bits LSB, CSB and MSB. For example, as illustrated in FIG. 13, the first state S1 corresponds to '111', the second state S2 corresponds to '110', the third state S3 corresponds to '100', the fourth state S4 corresponds to '000', the fifth S5 state corresponds to '010', the sixth S6 state corresponds to '011', the seventh state S7 corresponds to '001', and the eighth state S8 corresponds to '101'.

In this case, the first bit LSB may be determined using the first read voltage VR1 and the fifth read voltage VR5, the second bit CSB may be determined using the second read voltage VR2, the fourth read voltage V4 and the sixth read voltage VR6, and the third bit MSB may be determined using the third read voltage VR3 and the seventh read voltage VR7.

FIG. 14 illustrates a high-to-low read sequence.

In case of reading the first bit LSB, the fifth read voltage VR5 may be applied to the selected word line for the first sensing operation and the first read voltage VR1 may be applied to the selected word line. In case of reading the second bit CSB, the sixth read voltage VR6, the fourth read voltage VR4 and the second read voltage VR2 may be applied sequentially to the selected word line. In case of reading the third bit MSB, the seventh read voltage VR7 and the third read voltage VR3 may be applied sequentially to the selected word line.

Figure 15:
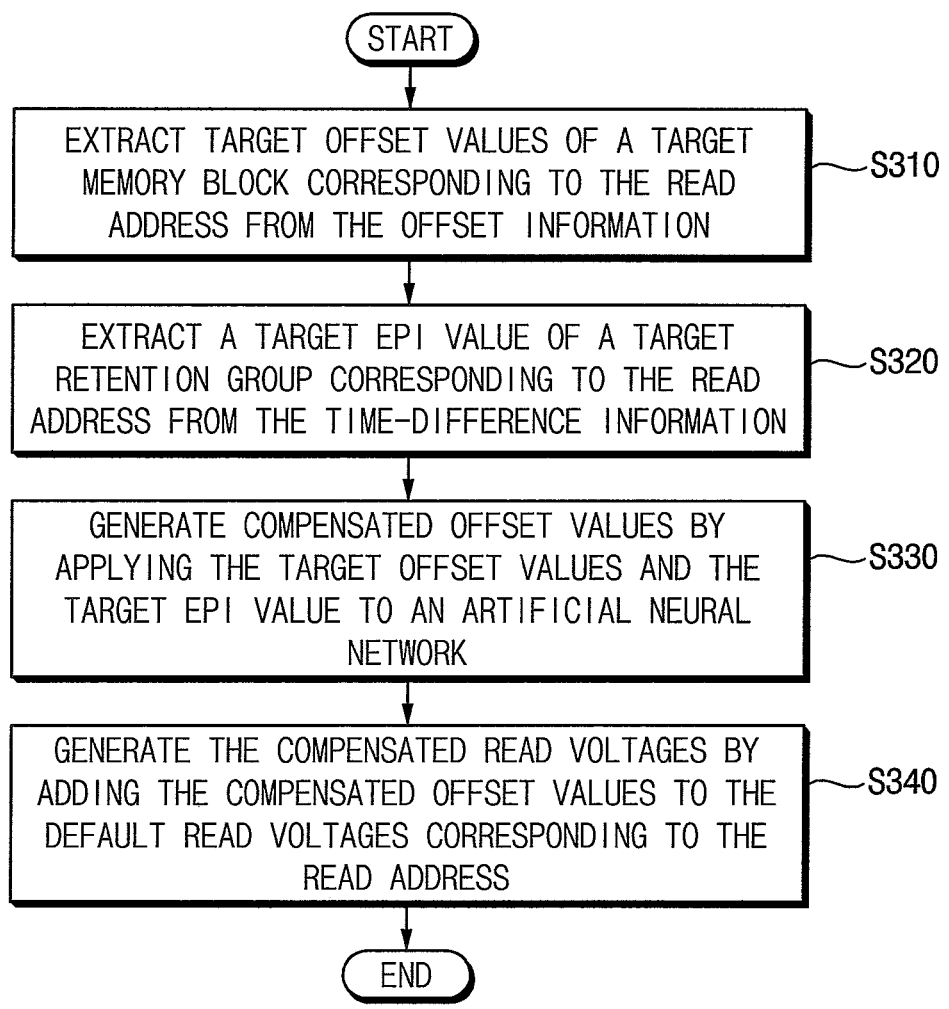
FIG. 15 is a flowchart illustrating generating compensated read voltages in a method of operating a nonvolatile memory device according to example embodiments.

FIG. 15 is a flowchart illustrating an example embodiment of generating compensated read voltages in a method of operating a nonvolatile memory device according to example embodiments.

Referring to FIG. 15, target offset values of a target memory block corresponding to a read address may be extracted from the offset information OFSINF as illustrated in FIG. 7 (S310). A target EPI value of a target retention group corresponding to the read address may be extracted from the time-difference information TDINF as illustrated in FIG. 8 (S320). Compensated offset values may be generated by applying the target offset values and the target EPI value to an artificial neural network (S330). The compensated read voltages may be generated or determined by adding the compensated offset values to the default read voltages corresponding to the read address (S340).

Hereinafter, example embodiments of generating the compensated read voltages are described in detail with reference to FIGS. 16 through 21.

Figure 16:
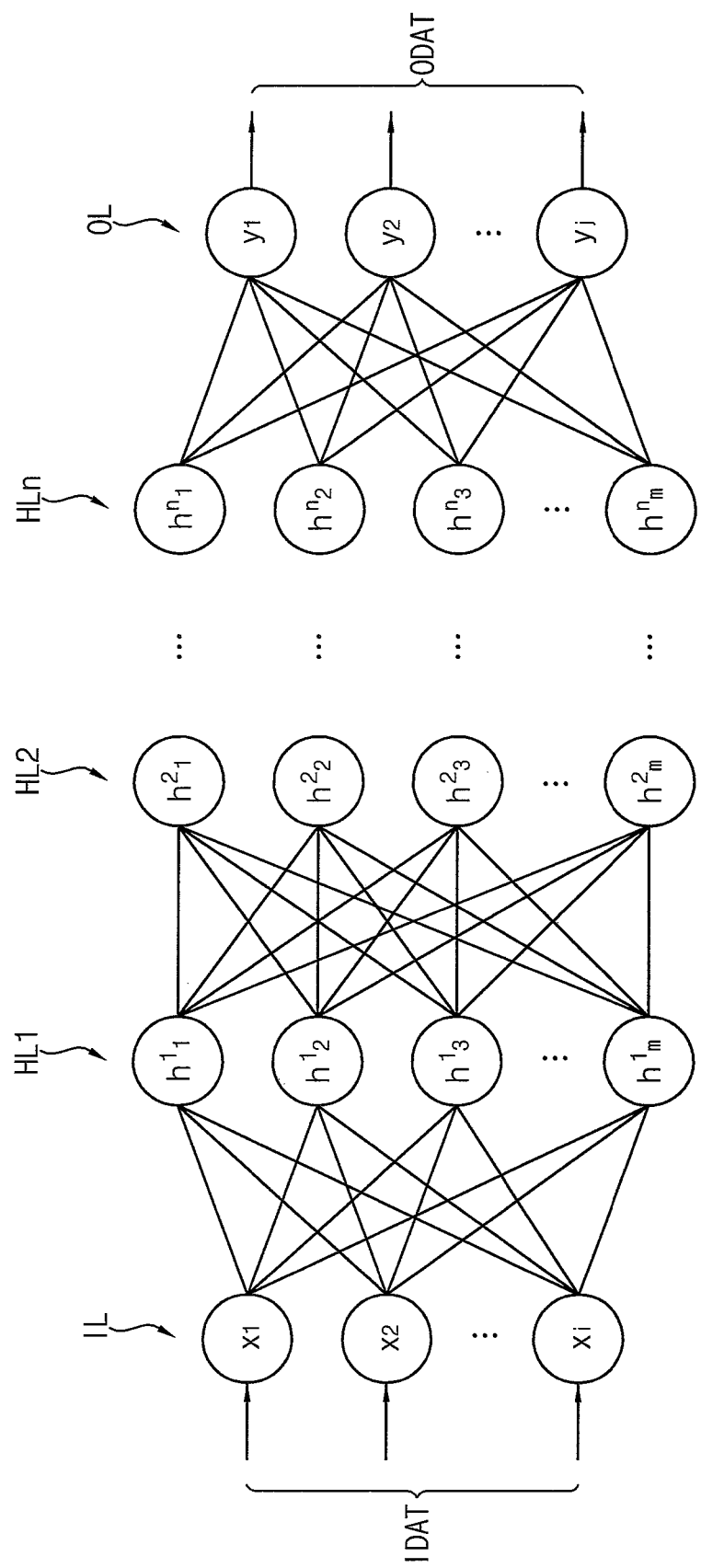
FIGS. 16 and 17 are diagrams for describing examples of an artificial neural network structure in a method of operating a nonvolatile memory device according to example embodiments.
Figure 17:
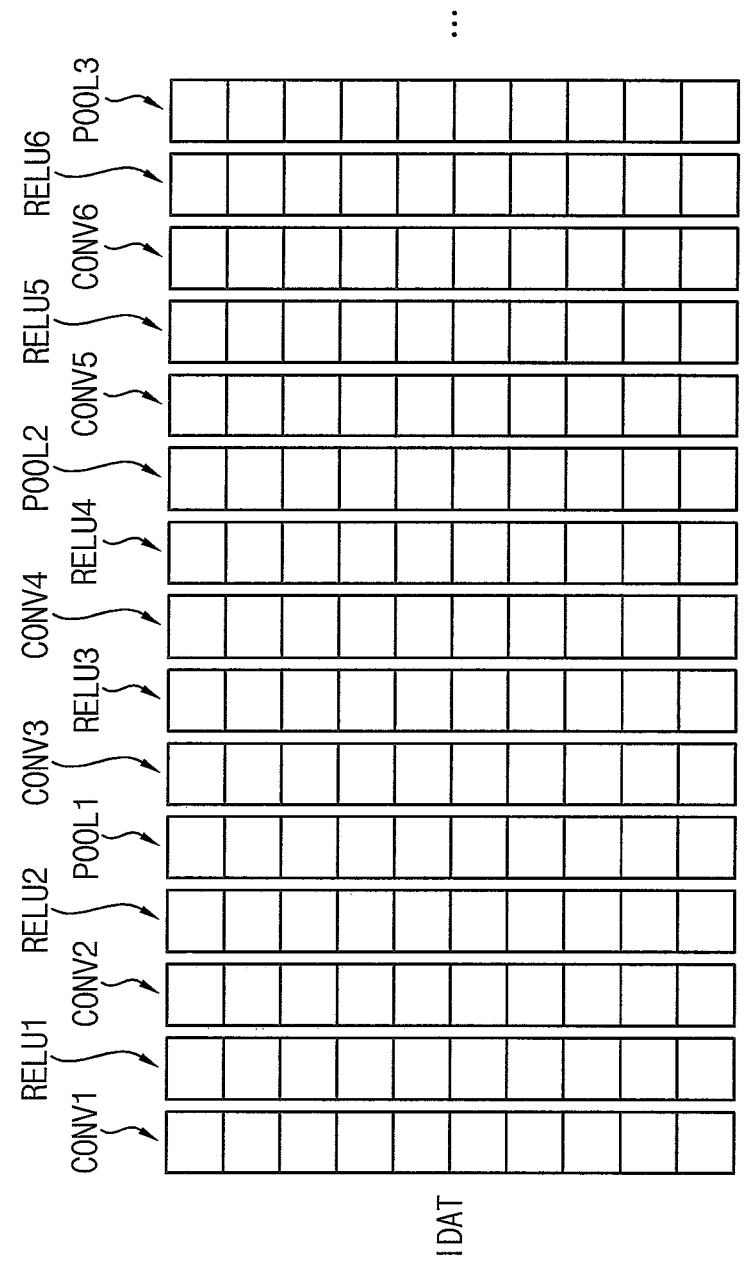

FIGS. 16 and 17 are diagrams for describing examples of an artificial neural network structure in a method of operating a nonvolatile memory device according to example embodiments.

Referring to FIG. 16, a general neural network may include an input layer IL, a plurality of hidden layers HL1, HL2, HLn and an output layer OL.

The input layer IL may include i input nodes x1, x2, . . . , xi, where i is a natural number. Input data (e.g., vector input data) IDAT with a length i may be input to the input nodes x1, x2, . . . , xi such that each element of the input data IDAT is input to a respective one of the input nodes x1, x2, . . . , xi.

The plurality of hidden layers HL1, HL2, HLn may include n hidden layers, where n is a natural number, and may include a plurality of hidden nodes $h^1_1$, $h^1_2$, $h^1_3$, . . . , $h^1_m$, $h^2_1$, $h^2_2$, $h^2_3$, . . . , $h^2_m$, $h^n_1$, $h^n_2$, $h^n_3$, . . . , $h^n_m$. For example, the hidden layer HL1 may include m hidden nodes $h^1_1$, $h^1_2$, $h^1_3$, . . . , $h^1_m$, the hidden layer HL2 may include m hidden nodes $h^2_1$, $h^2_2$, $h^2_3$, . . . , $h^2_m$, and the hidden layer HLn may include m hidden nodes $h^n_1$, $h^n_2$, $h^n_3$, . . . , $h^n_m$, where m is a natural number. The number of hidden nodes may be determined variously per hidden layer.

The output layer OL may include j output nodes $y_1$, $y_2$, . . . , $y_j$ to generate output data ODAT corresponding to the input data IDAT where j is a natural number.

A structure of the neural network illustrated in FIG. 16 may be represented by information on branches (or connections) between nodes illustrated as lines, and a weighted value assigned to each branch. Nodes within one layer may not be connected to one another, but nodes of different layers may be fully or partially connected to one another.

Each node (e.g., the node $h^1_1$) in FIG. 16 may receive an output of at least one previous node (e.g., the node $x_1$), may perform a computing operation, computation or calculation on the received output, and may output a result of the computing operation, computation or calculation as an output to at least one next node (e.g., the node $h^2_1$). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 16 may not be suitable for handling input image data (or input sound data) because each node (e.g., the node $h^1_1$) is connected to all nodes of a previous layer (e.g., the nodes $x_1$, $x_2$, . . . , $x_i$ included in the layer IL) and then the number of weighted values drastically increases as the size of the input image data increases. Thus, a convolutional neural network (CNN), which is implemented by combining the filtering technique with the general neural network, has been researched such that two-dimensional image data (e.g., the input image data) is efficiently trained by the convolutional neural network.

Referring to FIG. 17, a convolutional neural network may include a plurality of layers CONV1, RELU1, CONV2, RELU2, POOL1, CONV3, RELU3, CONV4, RELU4, POOL2, CONV5, RELU5, CONV6, RELU6, POOL3, and so on.

Unlike the general neural network, each layer of the convolutional neural network may have three dimensions of width, height, and depth, and thus data that is input to each layer may be volume data having three dimensions of width, height, and depth.

In further detail, parameters of each of convolutional layers CONV1, CONV2, CONV3, CONV4, CONV5 and CONV6 may consist of or include a set of learnable filters. Every filter may be spatially small (along width and height), but may extend through the full depth of an input volume. For example, during the forward pass, each filter may be slid (e.g., convolved) across the width and height of the input volume, and dot products may be computed between the entries of the filter and the input at any position. As the filter slides over the width and height of the input volume, a two-dimensional activation map indicating the responses of that filter at every spatial position may be generated. As a result, an output volume may be generated by stacking these activation maps along the depth dimension. For example, if input volume data having a size of 32×32×3 passes through the convolutional layer CONV1 having twelve filters with zero-padding, output volume data of the convolutional layer CONV1 may have a size of 32×32×12 (e.g., a depth of volume data increases).

Each of RELU layers RELU1, RELU2, RELU3, RELU4, RELU5 and RELU6 may perform a rectified linear unit operation that corresponds to an activation function defined by, e.g., a function $f(x)=\max(0, x)$ (e.g., an output is zero for all negative input x). Each of pooling layers POOL1, POOL2 and POOL3 may perform a down-sampling operation on input volume data along spatial dimensions of width and height. Typically, one convolutional layer (e.g., CONV1) and one RELU layer (e.g., RELU1) may form a pair of CONV/RELU layers in the convolutional neural network. Pairs of the CONV/RELU layers may be repeatedly arranged in the convolutional neural network. The pooling layer may be periodically inserted in the convolutional neural network.

Figure 18:
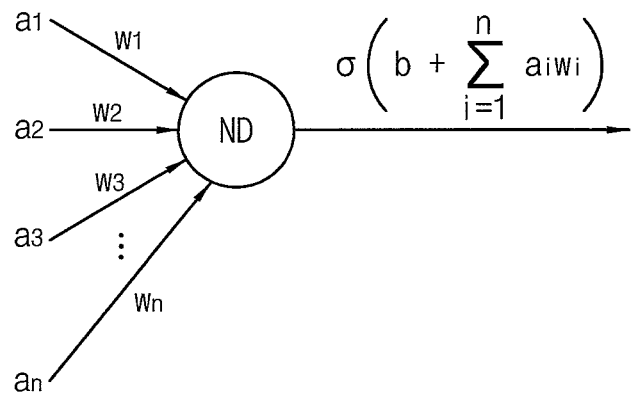
FIG. 18 is a diagram illustrating a node included in an artificial neural network according to example embodiments.

FIG. 18 is a diagram illustrating an example of a node included in an artificial neural network.

FIG. 18 illustrates an example node operation performed by a node ND in a neural network. When N inputs a1~an are provided to the node ND, the node ND may multiply the n inputs a1~an and corresponding n weights w1~wn, respectively, may sum n values obtained by the multiplication, may add an offset "b" to a summed value, and may generate one output value by applying a value to which the offset "b" is added to a specific function "σ". The learning operation may be performed based on the training data to update all nodes in the neural network.

Figure 19:
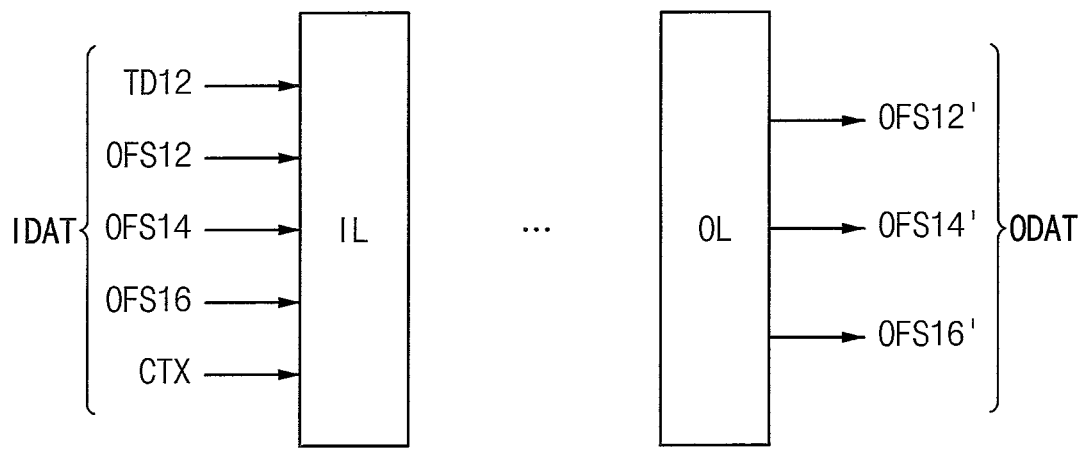
FIG. 19 is a diagram illustrating an artificial neural network in a method of operating a nonvolatile memory device according to example embodiments.

FIG. 19 is a diagram illustrating an artificial neural network in a method of operating a nonvolatile memory device according to example embodiments. FIG. 19 illustrates only an input layer IL and an output layer OL of an artificial neural network for convenience of illustration.

FIG. 19 illustrates an example embodiment of an artificial neural network that is trained to receive, as inputs of the artificial neural network, only the target offset values corresponding to each bit of a plurality of bits stored in each memory cell among the plurality of offset values and output the compensated offset values corresponding to the target offset values.

Referring to FIGS. 5 through 14 and 19, for example, the read address may correspond to the second retention group RGR12 of the first memory block BLK1 and the second bits CSB. As discussed above with reference to FIGS. 13 and 14, when reading the second bits CSB, the sixth read voltage VR6, the fourth read voltage VR4 and the second read voltage VR2 may be applied sequentially to the selected word line. In this case, the processor 3210 may extract the target offset values OFS12 (corresponding to the second read voltage VR2), OSF14 (corresponding to the fourth read voltage VR4) and OFS16 (corresponding to the sixth read voltage VR6) of the target memory block BLK1 corresponding to the read address from the offset information OFSINF. The processor 3210 may also extract the target EPI value TD12 of the target retention group RGR12 corresponding to the read address from the time-difference information TDINF. The processor 3210 may apply the target offset values OFS12, OFS14 and OFS16 and the target EPI value TD12 as the input data IDAT to the artificial neural network to generate the compensated offset values OFS12', OFS14' and OFS16' as the output data ODAT from the artificial neural network. The processor 3210 may generate the compensated read voltages by adding the compensated offset values OFS12', OFS14' and OFS16' to the default read voltages VR12, VR14 and VR16, respectively. The compensated read voltage may be decreased to be lower than the corresponding default read voltage when the compensated offset value is negative, and compensated read voltage may be increased to be higher than the corresponding default read voltage when the compensated offset value is positive.

In some example embodiments, as illustrated in FIG. 19, context information CTX may be input to the artificial neural network together with the target offset values (e.g., OFS12, OFS14 and OFS16) and the target EPI value (e.g., TD12). The context information CTX may include at least one of a block number of the target memory block corresponding to the read address and a program-erase cycle value corresponding to the read address.

FIG. 19 illustrates only the artificial neural network corresponding to the second bits CSB and the processor 3210. However, embodiments are not limited thereto and the processor 3210 may further include the artificial neural networks corresponding to the first bits LSB and the third bits MSB. As such, the processor 3210 of the storage controller 3200 may include a plurality of artificial neural networks corresponding to the number of bits stored in each memory cell and select the one artificial neural network corresponding to the read address to output the compensated offset values corresponding to the read address.

FIG. 20 is a diagram for describing process of training an artificial neural network in a method of operating a nonvolatile memory device according to example embodiments.

FIG. 20 illustrates an example of the training data and the measured offset values corresponding to the training data for supervised learning of the artificial neural network. In some example embodiments, the processor 3210 may train the machine learning module MLM based on the training offset and EPI values TD, OFS2, OFS4 and OFS6 and the measured offset values MOFS2, MOFS4 and MOFS6 corresponding to the training offset values OFS2, OFS4 and OFS6. The compensated offset values OFS2', OFS4' and OFS6', which are output from the artificial neural network based on the input training data, may be compared with the measured offset values MOFS, MOFS4 and MOFS6 corresponding to the ground truth data to optimize the parameters of the artificial neural network. In some example embodiments, the artificial neural network may be trained by another processor outside the storage system and the trained artificial neural network may be provided to and stored in the processor 3210.

In some example embodiments, the training data may further include a block number BLK3 and/or a wordline number WL# corresponding to the read address. The block number BLK3 and/or the wordline number WL# may be included in the context information CTX as described with reference to FIG. 19.

Figure 21:
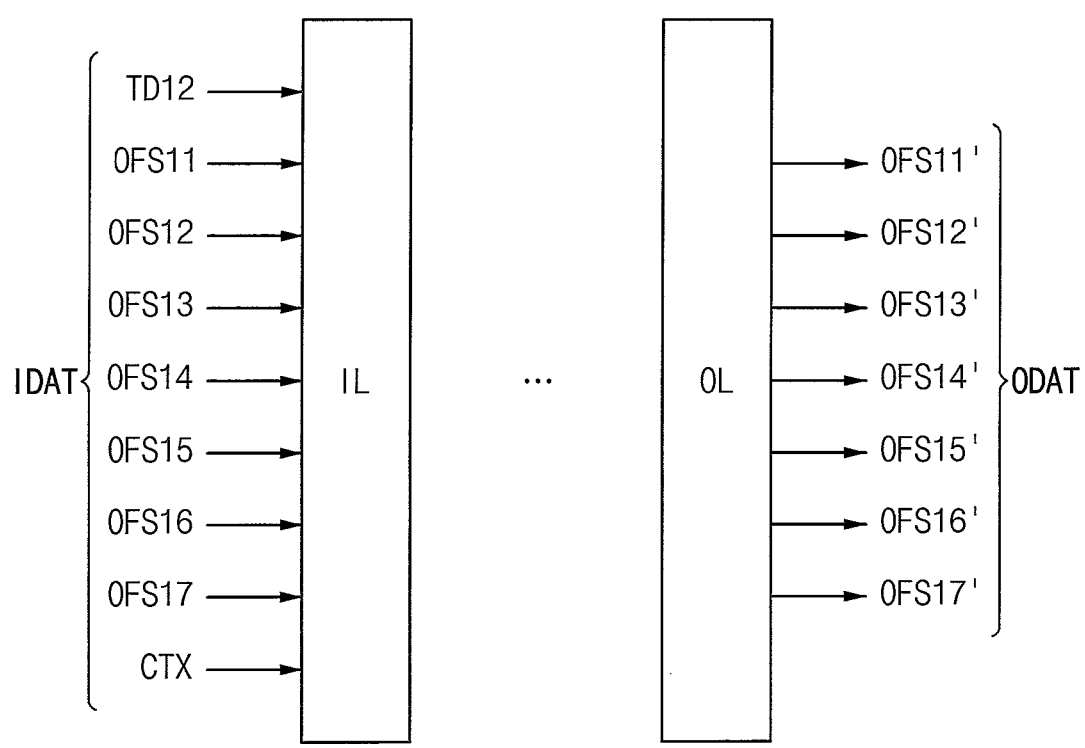
FIG. 21 is a diagram illustrating an artificial neural network in a method of operating a nonvolatile memory device according to example embodiments.

FIG. 21 is a diagram illustrating an artificial neural network in a method of operating a nonvolatile memory device according to example embodiments. The descriptions repeated with FIGS. 19 and 20 may be omitted.

FIG. 21 illustrates an example embodiment of an artificial neural network that is trained to receive, as inputs of the artificial neural network, all of the plurality of offset values to output the compensated offset values corresponding to the plurality of offset values.

Referring to FIGS. 5 through 14 and 21, for example, the read address may correspond to the second retention group RGR12 of the first memory block BLK1 and the second bits CSB. In this case, the processor 3210 may extract all of the target offset values OFS11~OFS17 of the target memory block BLK1 corresponding to the read address from the offset information OFSINF and extract the target EPI value TD12 of the target retention group RGR12 corresponding to the read address from the time-difference information TDINF. The processor 3210 may apply the target offset values OFS11~OFS17 and the target EPI value TD12 as the input data IDAT to the artificial neural network to generate the compensated offset values OFS11'~OFS17' as the output data ODAT from the artificial neural network. The processor 3210 may generate the compensated read voltages by adding the compensated offset values OFS11'~OFS17' to the default read voltages VR11~VR17, respectively. The compensated read voltage may be decreased to be lower than the corresponding default read voltage when the compensated offset value is negative, and compensated read voltage may be increased to be higher than the corresponding default read voltage when the compensated offset value is positive.

Figure 22:
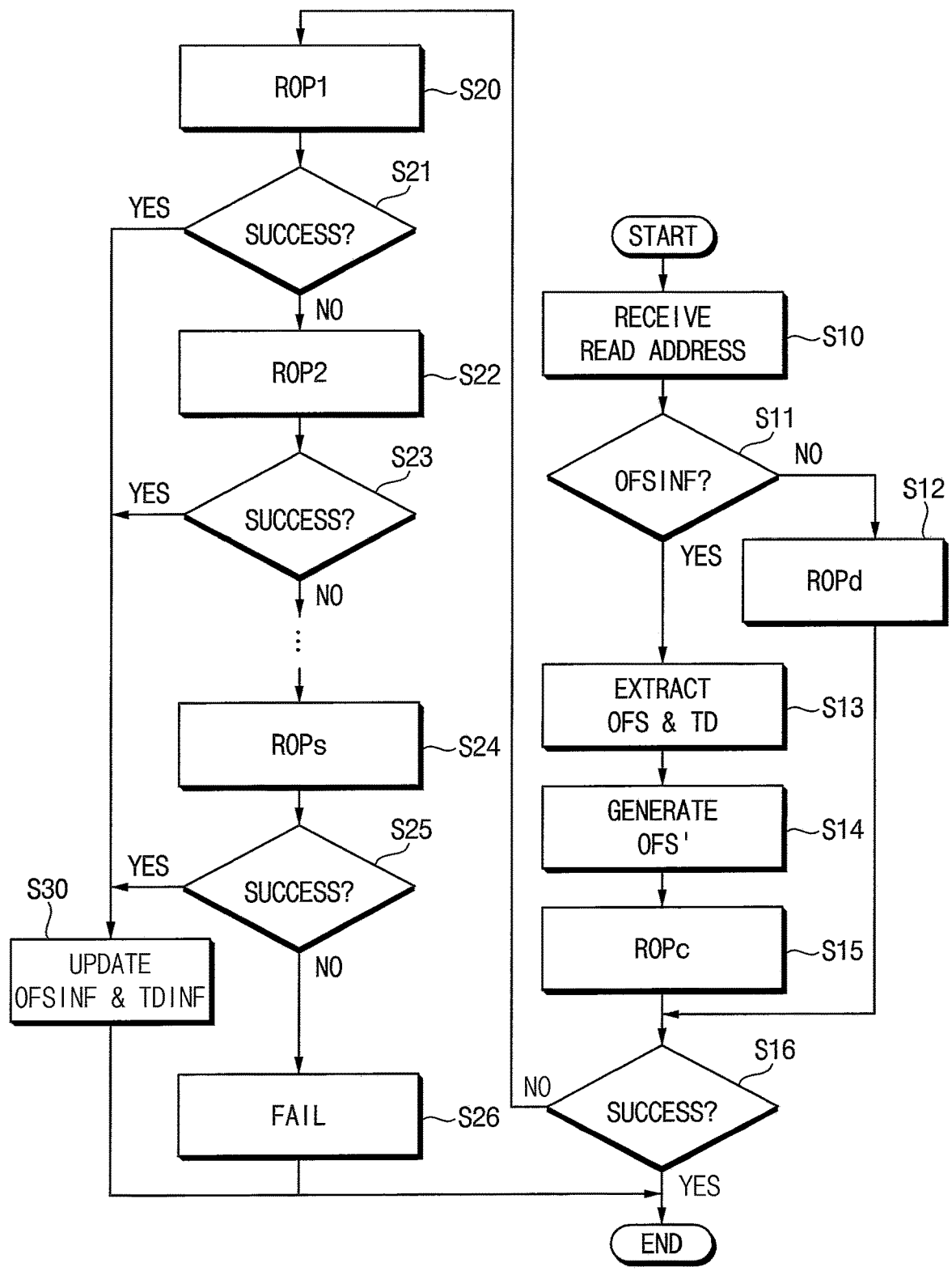
FIG. 22 is a flowchart illustrating a read process in a method of operating a nonvolatile memory device according to example embodiments.

FIG. 22 is a flowchart illustrating an example embodiment of a read process in a method of operating a nonvolatile memory device according to example embodiments.

Referring to FIGS. 9 and 22, the storage device 3000 may receive the read address for the read operation from the host device 2000 (S10). The storage device 3000 may determine whether the offset information OFSINF corresponding to the read address exists (S11). When the offset information OFSINF corresponding to the read address does not exist (S11: NO), the storage device 3000 may perform a read operation ROPd based on the plurality of default read voltages (S12). When the offset information OFSINF corresponding to the read address exists (S11: YES), the processor 3210 may extract the target offset values OFS and the target EPI values TD corresponding to the read address (S13), and generate the compensated offset values OFS' based on the extracted target offset and EPI values OFS and TD (S14). The compensated offset values OFS' may be generated using the artificial neural network that is trained as described above. The storage device 3000 may perform a read operation ROPc based on the compensated read voltages (S15).

As such, the read operation may be performed based on the plurality of default read voltages before the offset values corresponding to the read address are generated, and the read operation may be performed based the compensated read voltages after the offset values corresponding to the read address are generated.

The storage device 3000 may determine whether the read operation ROPd based on the default read voltages or the read operation ROPc based on the compensated read voltages is completed successfully (S16). When the read operation ROPd based on the default read voltages or the read operation ROPc based on the compensated read voltages is completed successfully (S16: YES), the storage device 3000 may transfer the read data to the host device 2000 and end the read sequence corresponding to the read address.

When the read operation ROPd based on the default read voltages or the read operation ROPc based on the compensated read voltages has failed (S16: NO), a read recovery process may be performed. The read recovery process may include performing a plurality of read operations ROP1~RORs sequentially (S20, S22, S24) until the read data are obtained and determining whether each of the read operations ROP1~RORs is completed successfully (S21, S23, S25). At least one of the read operations ROP1~RORs may include a valley search operation as will be described with reference to FIG. 24, at least one of the read operations ROP1~RORs may be performed based on updated corrected read voltages that are updated by the valley search operation.

When the read operation through the read recovery process is failed (S25: NO), the storage device 300 may inform the host device with a read fail (S26). When the read operation through the read recovery process is performed successfully (S21: YES, S23: YES or S25: YES), the offset information OFSINF and the time difference information TDINF may be updated (S30) as will be described with reference to FIGS. 25 and 26. The storage device 300 may transfer the read data to the host device 2000 and the read sequence corresponding to the read address is ended.

Hereinafter, the read recovery process is further described with reference to FIGS. 23 and 24.

Figure 23:
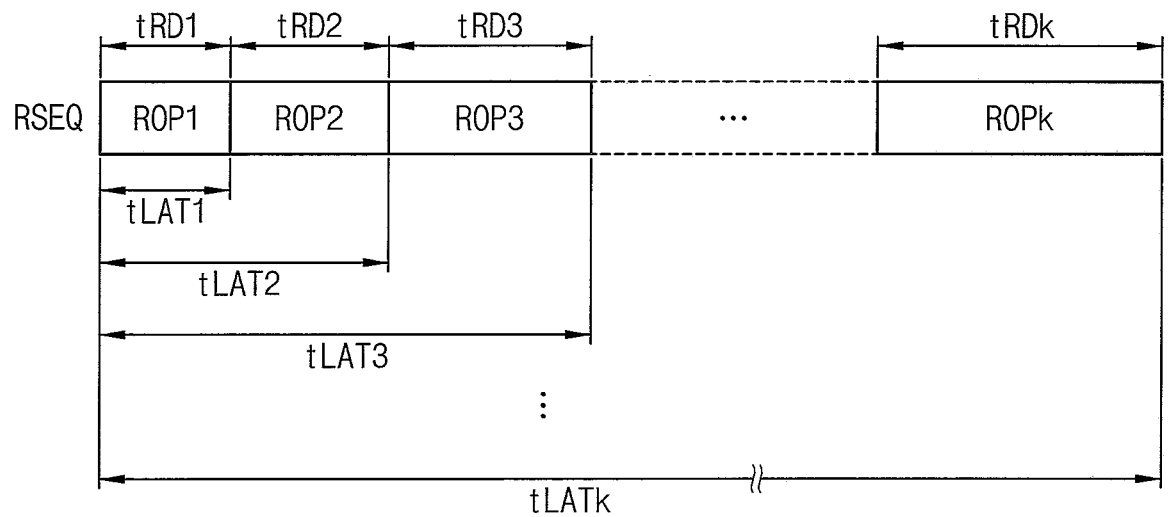
FIG. 23 is a diagram illustrating a read sequence in a method of operating a nonvolatile memory device according to example embodiments.

FIG. 23 is a diagram illustrating a read sequence in a method of operating a nonvolatile memory device according to example embodiments.

Referring to FIG. 23, a read sequence RSEQ may include a plurality of read operations ROP1~ROPk having respective read times tRD1~tRDk different from each other. There is a trade-off between length of read time and the accuracy of the corresponding read operation. In other words, read operations having shorter read times also have a higher probability of a read fail outcome, while read operations having longer read times have a higher probability of a successful read operation outcome. Accordingly, each read sequence RSEQ may be set such that a read operation having the shorter read time will be performed before a read operation having the longer read time, as illustrated for example in FIG. 23. Here, the first read operation ROP1 having a shortest read time tRD1 is first performed, then a second read operation ROP2 having a second read time tRD2 longer than the first read time tRD1 is performed after the first read operation ROP1, and then a third read operation ROP3 having the third read time tRD3 longer than the second read time tRD2 is performed after the second read operation ROP2, and then so forth up to a k-th read operation ROPk having the longest read time tRDk.

Each of the read operations ROP1~ROPk may be performed using error checking and correction (ECC) decoding. The read operations ROP1~ROPk in the selected read sequence RSEQ may be performed sequentially until valid data is obtained, as properly indicated by the ECC decoding. Once valid data are obtained, subsequent read operations will not be performed, and the read sequence RSEQ is ended.

As a result, the read latency associated with the selected read sequence corresponds to a sum of the read times of the read operations that are performed until the valid data is obtained. In the illustrated example of FIG. 23, the read latency tLAT1 corresponds to the first read time tRD1 if valid data is obtained by the first read operation ROP1, the read latency tLAT2 corresponds to a sum tRD1+tRD2 for the first read time tRD1 and the second read time tRD2 if valid data is obtained by the second read operation ROP2, the read latency tLAT3 corresponds to a sum tRD1+tRD2+tRD3 for the first read time tRD1, the second read time tRD2 and the third read time tRD3 if valid data is obtained by the third read operation ROP3, and the read latency tLATk corresponds to a sum tRD1+tRD2+ . . . +tRDk of all read times tRD1~tRDk if valid data is obtained by the last read operation ROPk.

The read recovery process in FIG. 22 may include the read sequence including the plurality of read operations ROP1~PORs as described with reference to FIG. 23.

Figure 24:
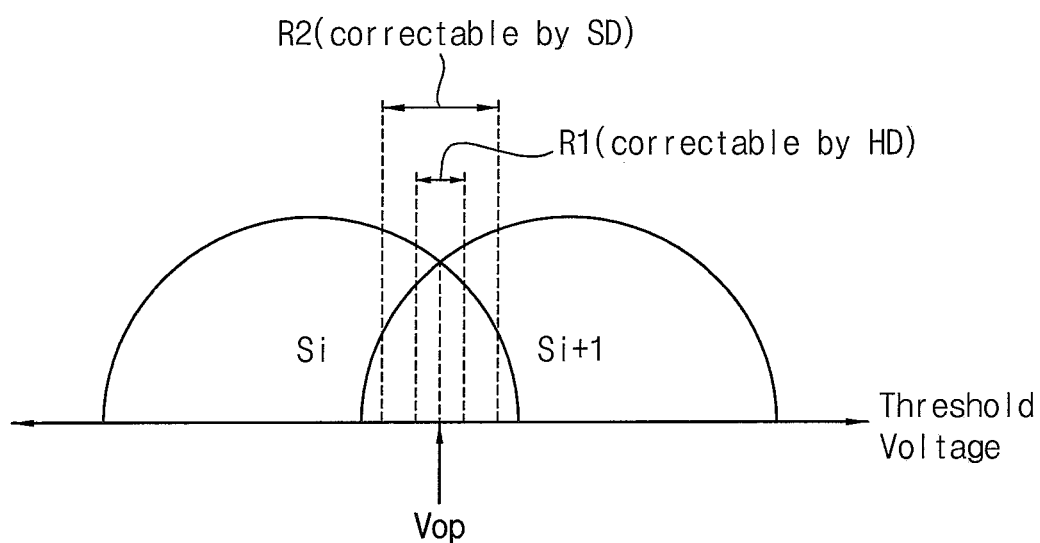
FIG. 24 is a diagram for describing a default read voltage and a corrected read voltage.

FIG. 24 is a diagram for describing a default read voltage and a corrected read voltage.

Threshold voltage distributions for two adjacent states Si and Si+1 are shown in FIG. 24 assuming the use of a flash memory device.

An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operating condition, the difference between the predetermined read voltage and the optimal read voltage increases. As this difference increases, the bit error rate (BER) or the probability of the read fail also increases.

When the predetermined default voltage is included in a first voltage range R1, the error in the read data may be corrected by the ECC decoding with hard decision (HD). When the default voltage is included in a second voltage range R2, the error in the read data may be corrected by the ECC decoding with soft decision (SD).

When bit errors in the read data are too numerous and the predetermined read voltage is out of the second range R2, valid data will not be obtained using applicable ECC decoding. When valid data is not obtained by execution of the read operations based on the default read voltage, a valley search operation may be performed to determine the corrected read voltages corresponding to the optimal read voltages Vop. Thereafter, a read operation may be performed using the corrected read voltages. Such valley search operations and read operations based on the corrected read voltages may be referred to as a "voltage-corrected read operation". One or more of the read operations ROP1~RORs provided in the read sequence RSEQ as described with reference to FIG. 23 may include a voltage-corrected read operation.

The valley search operations take a relatively long amount of time and therefore degrade the performance of the nonvolatile memory device and the storage system including the nonvolatile memory device. According to example embodiments, the read sequence RSEQ may prioritize obtaining the compensated read voltages based on the offset information and the time difference information as described above, before the voltage-corrected operation taking too much time. Thus, the performance of the storage system may be enhanced.

FIG. 25 is a diagram for describing update of offset information in a method of operating a nonvolatile memory device according to example embodiments, and FIG. 26 is a diagram for describing update of time-difference information in a method of operating a nonvolatile memory device according to example embodiments.

FIGS. 25 and 26 illustrate an example of updating the offset information OFSINF of FIG. 7 and the time difference information TDINF of FIG. 8 when the read address corresponds to the second retention group RGP12 of the first memory block BLK1.

Referring to FIGS. 22 and 25, when the read operation based on the updated corrected read voltages is completed successfully, the offset information OFSINF of the target memory block BLK1 corresponding to the read address may be updated based on the updated corrected read voltages (S30). In other words, the first through seventh offset values OFS11~OFS17 of the first memory block BLK1 in FIG. 7 may be replaced with the first through seventh offset values OFS11'~OFS17' of the first memory block BLK1 in FIG. 25.

Referring to FIGS. 22 and 26, when the read operation based on the updated corrected read voltages is completed successfully, the time difference information TDINF of the target memory block BLK1 corresponding to the read address such that the EPI value TD12 of the target retention group RGR12 corresponding to the read address becomes zero (S30). In other words, the reference retention group may be changed from the first retention group RGR11 having the EPI value of zero as illustrated in FIG. 8 to the second retention group RGR12 having the EPI value of zero as illustrated in FIG. 26. As illustrated in FIG. 26, the EPI value of the second retention group RGR12 may be changed from 40 to zero, and the EPI values of the other retention groups RGR11, RGR13 and RGR14 may be changed from zero, 160 and 260 to −40, 120 and 220, respectively, which are the relative values with respect to the value of zero of the second retention group RGR12 corresponding to the reference retention group.

Figure 27:
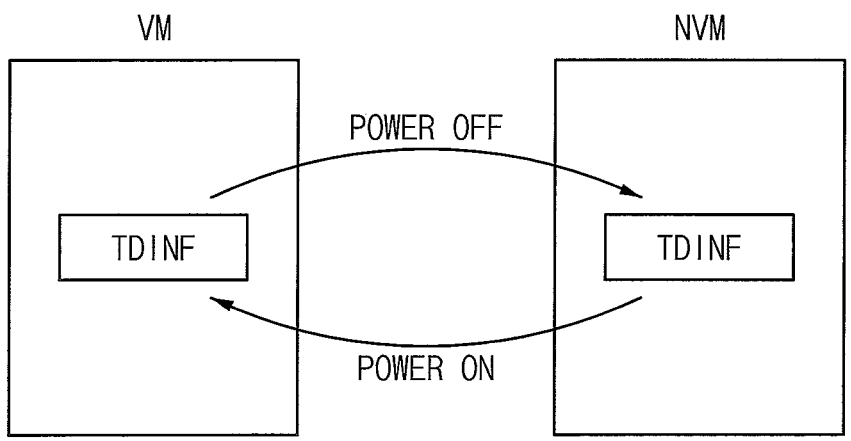
FIG. 27 is a diagram for describing backup of time-difference information in a method of operating a nonvolatile memory device according to example embodiments.

FIG. 27 is a diagram for describing backup of time-difference information in a method of operating a nonvolatile memory device according to example embodiments.

Referring to FIG. 27, the time difference information TDINF stored in the volatile memory device VM may be stored or backed up in the nonvolatile memory device NVM when the storage device including the nonvolatile memory device NVM is powered off. The time difference information TDINF may be read from the nonvolatile memory device NVM and stored in the volatile memory device VM when the storage device is powered on again. In general, the volatile memory device VM has a higher operation speed than the nonvolatile memory device NVM and the time difference information TDINF in the volatile memory device VM may be used and updated. The offset information stored in the volatile memory device VM may be deleted when the storage device is powered off.

Figure 28:
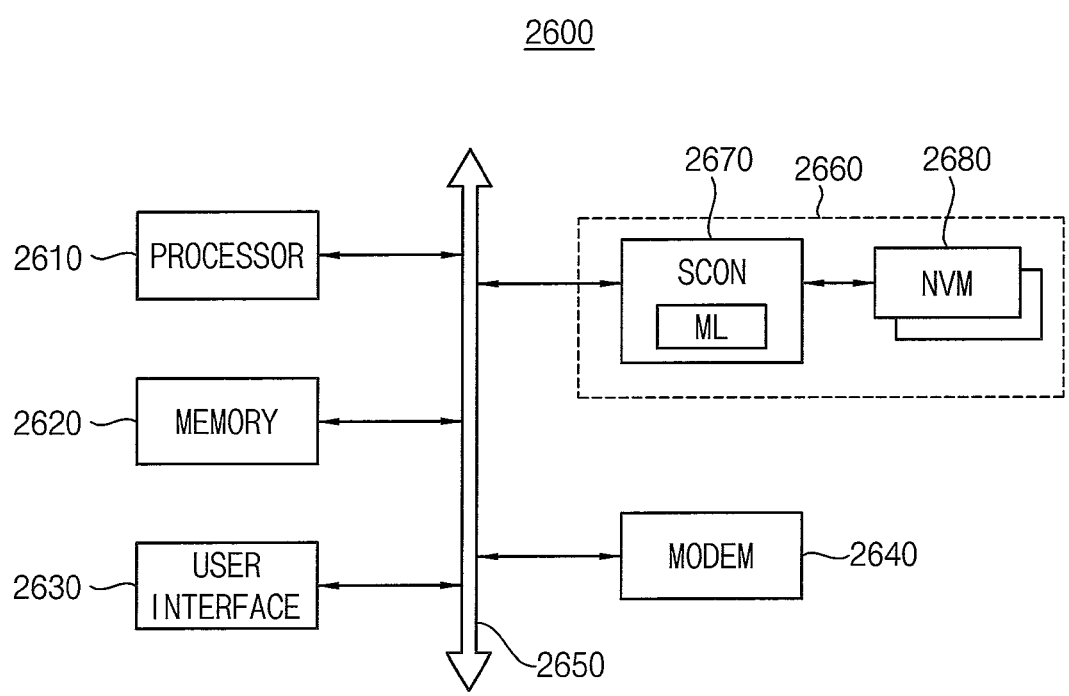
FIG. 28 is a block diagram illustrating a computing system according to example embodiments.

FIG. 28 is a block diagram illustrating a computing system according to example embodiments.

Referring to FIG. 28, a computing system 2600 includes a processor 2610, a memory device 2620, a user interface 2630, a bus 2650 and a storage system 2660. In some embodiments, the computing system 2600 may further include a modem 2640, such as a baseband chipset.

The processor 2610 may perform specific calculations or tasks. For example, the processor 2610 may be a microprocessor, a central processing unit (CPU), a digital signal processor, or the like. The processor 2610 may be coupled to the memory device 2620 via a bus 2650, such as an address bus, a control bus, and/or a data bus. Further, the processor 2610 may be coupled to an extension bus, such as a peripheral component interconnect (PCI) bus, and may control the user interface 2630 including at least one input device, such as a keyboard, a mouse, a touch screen, etc., and at least one output device, a printer, a display device, etc. The modem 2640 may perform wired or wireless communication with an external device.

The storage system 2660 may include a storage controller SCON 2670 and nonvolatile memory devices NVM 2680. The storage controller 2670 may include a machine learning device ML to implement the machine learning module or the artificial neural network module as described above to perform the method of operating the nonvolatile memory devices NVM according to example embodiments.

As described above, the storage device including the nonvolatile memory device and the method of operating the nonvolatile memory device according to example embodiments may increase probability of success of the read operation and enhance performance of the nonvolatile memory device and the storage device by generating the time-difference information and adjusting the read voltages using the time difference information.

In addition, the storage device including the nonvolatile memory device and the method of operating the nonvolatile memory device according to example embodiments may further enhance the performance of the nonvolatile memory device and the storage device by generating the optimal read voltages using the artificial neural network.

In addition, the storage device including the nonvolatile memory device and the method of operating the nonvolatile memory device may enhance utilization of the nonvolatile memory device by efficiently supporting a zoned space (ZNS) write scheme.

As will be appreciated by one skilled in the art, example embodiments of the disclosure may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

The disclosure may be applied to any electronic devices and systems including a nonvolatile memory device. For example, the disclosure may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an autonomous driving system, etc.

At least one of the components, elements, modules or units (collectively "components" in this paragraph) represented by a block in the drawings may be embodied as various numbers of hardware, software and/or firmware structures that execute respective functions described above, according to an example embodiment. These components may include, for example, the CPU 2100, the memory 2200, the HCI 2300, the CPU 3210, the ECC 3220, the host interface 3230, the VM 3240, the NVM interfaces 3250, the EPI 3260, the page buffer circuit 410, the data input/output circuit 420, the address decoder 430, the control circuit 450, the voltage generator 460, the processor 2610, the memory device 2620, the user interface 2630, and the modem 2640, shown in FIGS. 9, 10 and 28, not being limited thereto. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components.

It will be also understood that, although in example embodiments related to methods or flowcharts, a step or operation is described later than another step or operation, the step or operation may be performed earlier than the other step or operation unless the other step or operation is described as being performed after the step or operation.

While example embodiments have been described with reference to the accompanying drawings, it will be apparent to those skilled in the art that modifications and variations could be made without departing from the scope of the present disclosure.

What is claimed is:

1. A method of operating a nonvolatile memory device, comprising:
dividing a memory block of a plurality of memory blocks provided in the nonvolatile memory device into a plurality of retention groups;
generating time-difference information comprising a plurality of erase program interval (EPI) values corresponding to the plurality of retention groups;
generating offset information comprising a plurality of offset values corresponding to differences between a plurality of first read voltages and a plurality of corrected read voltages;
generating a plurality of second read voltages corresponding to a read address based on the offset information and the time-difference information; and
performing a read operation to read data from the nonvolatile memory device based on the read address and the plurality of second read voltages.

2. The method of claim 1, further comprising performing a zoned namespace (ZNS) write scheme such that each of the plurality of memory blocks respectively stores data corresponding to a single application.

3. A storage device comprising:
a nonvolatile memory device comprising a plurality of memory blocks; and
a storage controller configured to control the nonvolatile memory device,
wherein the storage controller is configured to:
divide a memory block of the plurality of memory blocks into a plurality of retention groups;
generate time-difference information comprising a plurality of erase program interval (EPI) values corresponding to the plurality of retention groups;
generate offset information comprising a plurality of first offset values corresponding to differences between a plurality of first read voltages and a plurality of corrected read voltages;

generate a plurality of second read voltages corresponding to a read address based on the offset information and the time-difference information; and perform a read operation to read data from the nonvolatile memory device based on the read address and the plurality of second read voltages.

4. The storage device of claim 3, wherein the storage controller is further configured to:

extract target offset values of the memory block corresponding to the read address;

extract a target EPI value of a target retention group, from among the plurality of retention groups, corresponding to the read address;

generate a plurality of second offset values by providing the target offset values and the target EPI value to an artificial neural network; and generate the plurality of second read voltages by respectively adding the plurality of second offset values to the plurality of first read voltages corresponding to the read address.

5. The storage device of claim 4, wherein the storage controller is further configured to train the artificial neural network based on training EPI values and measured offset values corresponding to the training EPI values.

6. The storage device of claim 4, wherein the storage controller is further configured to:

receive, by the artificial neural network, only the target offset values among the plurality of first offset values which correspond to a plurality of bits of the memory block; and output, by the artificial neural network, the plurality of second offset values corresponding to the target offset values.

7. The storage device of claim 4, wherein the storage controller is further configured to:

receive, by the artificial neural network, each of the plurality of first offset values; and output, by the artificial neural network, the plurality of second offset values corresponding to the plurality of first offset values.

8. The storage device of claim 4, wherein the storage controller is further configured to provide, to the artificial neural network, the target offset values, the target EPI value, and any one or any combination of a block number of a target memory block corresponding to the read address and a program-erase cycle value corresponding to the read address.

9. The storage device of claim 3, wherein the plurality of retention groups comprises a reference retention group having an EPI value of zero, and wherein the plurality of first offset values of the memory block correspond to the reference retention group.

10. The storage device of claim 9, wherein the plurality of corrected read voltages corresponding to the reference retention group are equal to the plurality of second read voltages.

11. The storage device of claim 3, wherein the storage controller is further configured to:

perform the read operation based on the plurality of first read voltages before the plurality of first offset values corresponding to the read address are generated; and perform the read operation based the plurality of second read voltages after the plurality of first offset values corresponding to the read address are generated.

12. The storage device of claim 11, wherein the storage controller is further configured to:

perform a valley search operation to update the plurality of corrected read voltages, based on the read operation performed using the plurality of first read voltages or the read operation using the plurality of second read voltages failing; and perform the read operation based on updated corrected read voltages that are updated by the valley search operation.

13. The storage device of claim 12, wherein the storage controller is further configured to update the offset information of a target memory block corresponding to the read address using the updated corrected read voltages based on the read operation performed using the updated corrected read voltages being completed successfully.

14. The storage device of claim 13, wherein the storage controller is further configured to update the time-difference information such that an EPI value of a target retention group corresponding to the read address becomes zero based on the read operation performed using the updated corrected read voltages being completed successfully.

15. The storage device of claim 3, wherein the storage controller is further configured to store the time-difference information in the nonvolatile memory device based on a command to power off the storage device.

16. The storage device of claim 15, wherein the storage controller is further configured to delete the offset information based on the command to power off the storage device.

17. The storage device of claim 15, wherein the storage controller is further configured to read the time-difference information from the nonvolatile memory device based on the storage device being powered on.

18. The storage device of claim 3, wherein the storage controller is further configured to perform a zoned namespace (ZNS) write scheme such that each of the plurality of memory blocks respectively stores data corresponding to a single application.

19. The storage device of claim 3, wherein the storage controller is further configured to generate the plurality of second read voltages using an artificial neural network that is trained based on training EPI values and measured offset values corresponding to the training EPI values.

20. A storage device comprising:

a nonvolatile memory device; and a storage controller configured to:

divide a memory block, from among a plurality of memory blocks of the nonvolatile memory device, into a plurality of retention groups;

generate time-difference information comprising a plurality of erase program interval (EPI) values corresponding to the plurality of retention groups;

generate offset information comprising a plurality of first offset values corresponding to differences between a plurality of first read voltages and a plurality of corrected read voltages;

train an artificial neural network based on training EPI values and measured offset values corresponding to the training EPI values;

generate a plurality of second offset values by providing the offset information and the time-difference information to the artificial neural network;

generate a plurality of second read voltages by respectively adding the plurality of first offset values to the plurality of first read voltages; and perform a read operation to read data from the nonvolatile memory device based on a read address and the plurality of second read voltages.

* * * * *